Figure 1:
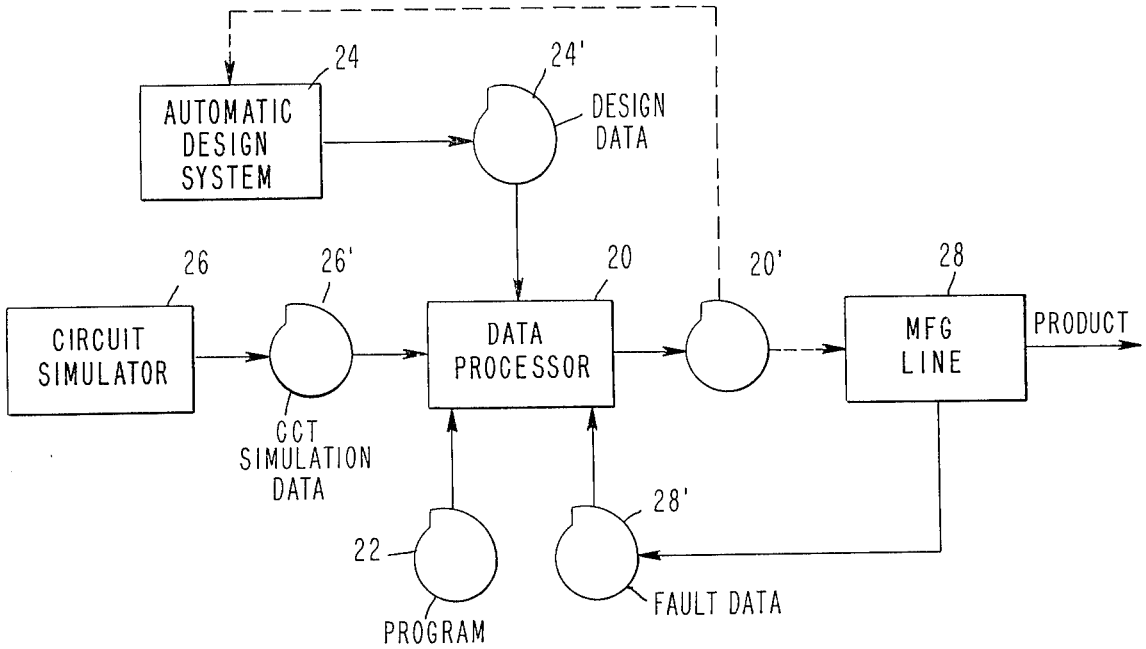

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MARCH 2, 1976

944 O.G. 41

T944,007

TESTING SYSTEMS AND PROCESSES FOR MANUFACTURING COMPLEX ARTICLES

Robert Middleton Booth, Jr., Wappingers Falls, N.Y., Robert Runyan Elam, Manassas, Va., Larry Wooley Holmstrom, Poughkeepsie, N.Y., Keith Wesley Lallier, Reston, Va., Lawrence Kenneth Lange, Wappingers Falls, N.Y., Chung Up Lee, Manassas, Va., Eugen Igor Muehldorf, Potomac, Md., and Prem Puri, Fairfax, William Rosenbluth, Reston, and Anil D. Savkar, Annandale, Va., assignors to International Business Machines Corporation, Armonk, N.Y.

Continuation of abandoned application Ser. No. 391,891, Aug. 27, 1973. This application Dec. 9, 1974, Ser. No. 531,008

Int. Cl. G06f *15/46*

U.S. Cl. 444—1

34 Sheets Drawing. 77 Pages Specification

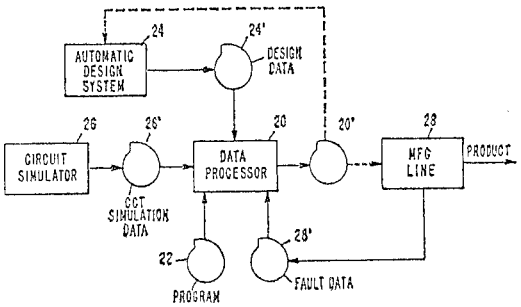

In a data processing system, a complex article, e.g. an integrated circuit may be identified by the system as an economically acceptable article after partial or less than one hundred percent testing by the steps of: (a) storing topological data or geometry of each physical element for embodying a logical net in an integrated circuit; (b) storing test simulation results of each logical state in the logical nets embodied in the integrated circuit; (c) identifying fault sensitive geometry in all logical elements and nets that perform and interact in achieving a design function for the integrated circuit; (d) identifying geometry for the logical elements and net for which no test simulation could be determined; (e) tabulating the sensitive areas of untested geometries; (f) calculating fault occurrence rates for the sensitive geometries; (g) adjusting the fault occurrence rates for the sensitive geometries for (1) production experience and (2) clustered distribution of faults instead of uniform distribution of faults, and (h) projecting (1) the yield of tested articles and (2) the quantity of defective articles shipped when full or one hundred percent testing is not applied to the articles.

OVER-ALL FLOW

OVER-ALL FLOW

FIG. 9A

TABLE DEFINITIONS (ALL TABLES 50 ITEMS MAX. LENGTH)

N1 — DIFFUSION OPEN GEOMETRY

| ΔW | ΔL TOTAL | ΔL UNTESTED |
|---|---|---|
| | | |

N4 — METAL OPEN GEOMETRY

| (SAME AS N1) |
|---|

K1 — DIFFUSION SHORT GEOMETRY

| ΔW | NET SHORT ΔL | | STUCK SHORT ΔL | |
|---|---|---|---|---|
| | TOTAL | UNTESTED | TOTAL | UNTESTED |
| | | | | |

K4 — METAL SHORT GEOMETRY

| (SAME AS K1) |
|---|

NV — CONTACT

| CONT TYPE | VIA SIZE | | | | CONT USE COUNT | |
|---|---|---|---|---|---|---|
| | ΔX2 | ΔY2 | ΔX4 | ΔY4 | TOTAL | UNTESTED |
| | | | | | | |

NG — GATES

| | (SAME AS NV) | | |
|---|---|---|---|

NS — COMPLEX BOOK CONTACTS & GATES

| COMPLEX BOOK TYPE | BOOK USAGE COUNT | | SUM AREA PER BOOK | |
|---|---|---|---|---|
| | TOTAL | UNTESTED | VIAS | GATE 1 |
| | | | | |

NB — NORMAL BOOK GEOMETRY

| NORMAL BOOK TYPE | SENSITIVE GEOMETRY USAGE | | | | | | | |
|---|---|---|---|---|---|---|---|---|
| | SOURCE DIFF. ΔL | | SOURCE VIA COUNT | | DRAIN DIFF. ΔL | | LOAD DEVICE USAGE | |
| | TOTAL | UNTESTED | TOTAL | UNTESTED | TOTAL | UNTESTED | TOTAL | UNTESTED |
| | | | | | | | | |

NB — CDS DEFINED CONSTANTS

| SOURCE DIFF. | | DRAIN DIFF. | | GROUND BUS VIA | | VOLTAGE BUS VIA | | LOAD DEVICE GATE | | | | L.P. EXTENSION PIECES | | | |
|---|---|---|---|---|---|---|---|---|---|---|---|---|---|---|---|
| | | | | | | | | | | | | DRAIN | | BUS | |
| ΔW | NO. FINGERS | ΔW | NO. FINGERS | ΔX2 | ΔY2 | ΔX2 | ΔY2 | ΔX2 | ΔY2 | ΔW4 | ΔL4 | ΔW1 | ΔL1 | ΔW1 | ΔL1 |
| | | | | | | | | | | | | | | | |

FIG. 9B

TBL TABLE

COUNT OF VALID ENTRIES

| SECTION | |
|---|---|
| 1 | |
| 2 | |
| 3 | |
| 4 | |
| 5 | |
| 6 | |

SECTION 1 — CONTACTS

| AREA | COUNT OF TOTAL USAGE | COUNT OF UNTESTED USAGE | |
|---|---|---|---|
| | | | |
| Ø | ΣA TOTAL | ΣA UNTESTED | |

SECTION 2 — (GATES)

| AREA | COUNT OF TOTAL USAGE | COUNT OF UNTESTED USAGE | |
|---|---|---|---|
| | | | |
| Ø | ΣA TOTAL | ΣA UNTESTED | |

SECTION 3 — (DIFFUSION OPENS)

| ΔW | ΔL TOTAL | ΔL UNTESTED | $R_s$ | $L_s$ TOTAL | $L_s$ UNTESTED | |
|---|---|---|---|---|---|---|
| | | | | ↓ | ↓ | |
| Ø | Ø | $R_o$ | Ø | (SUM) | (SUM) | |

SECTION 4 — (DIFFUSION SHORTS)

| ΔW | "STUCK" TYPE ΔL | | "NET" TYPE ΔL | | $R_s$ | $L_s$ TOTAL | $L_s$ UNTESTED |
|---|---|---|---|---|---|---|---|
| | TOTAL | UNTESTED | TOTAL | UNTESTED | | | |
| | | | | | | ↓ | ↓ |
| Ø | Ø | Ø | Ø | $R_o$ | Ø | (SUM) | (SUM) |

SECTION 5 — (METAL OPENS)

| ΔW | ΔL TOTAL | ΔL UNTESTED | $R_s$ | $L_s$ TOTAL | $L_s$ UNTESTED | |
|---|---|---|---|---|---|---|
| | | | | ↓ | ↓ | |
| Ø | Ø | $R_o$ | Ø | (SUM) | (SUM) | |

SECTION 6 — (METAL SHORTS)

| ΔW | "STUCK" TYPE ΔL | | "NET" TYPE ΔL | | $R_s$ | $L_s$ TOTAL | $L_s$ UNTESTED |
|---|---|---|---|---|---|---|---|
| | TOTAL | UNTESTED | TOTAL | UNTESTED | | | |
| | | | | | | ↓ | ↓ |
| Ø | Ø | Ø | Ø | $R_o$ | Ø | (SUM) | (SUM) |

PHYSICAL/LOGICAL AUDIT

Figure 11A:
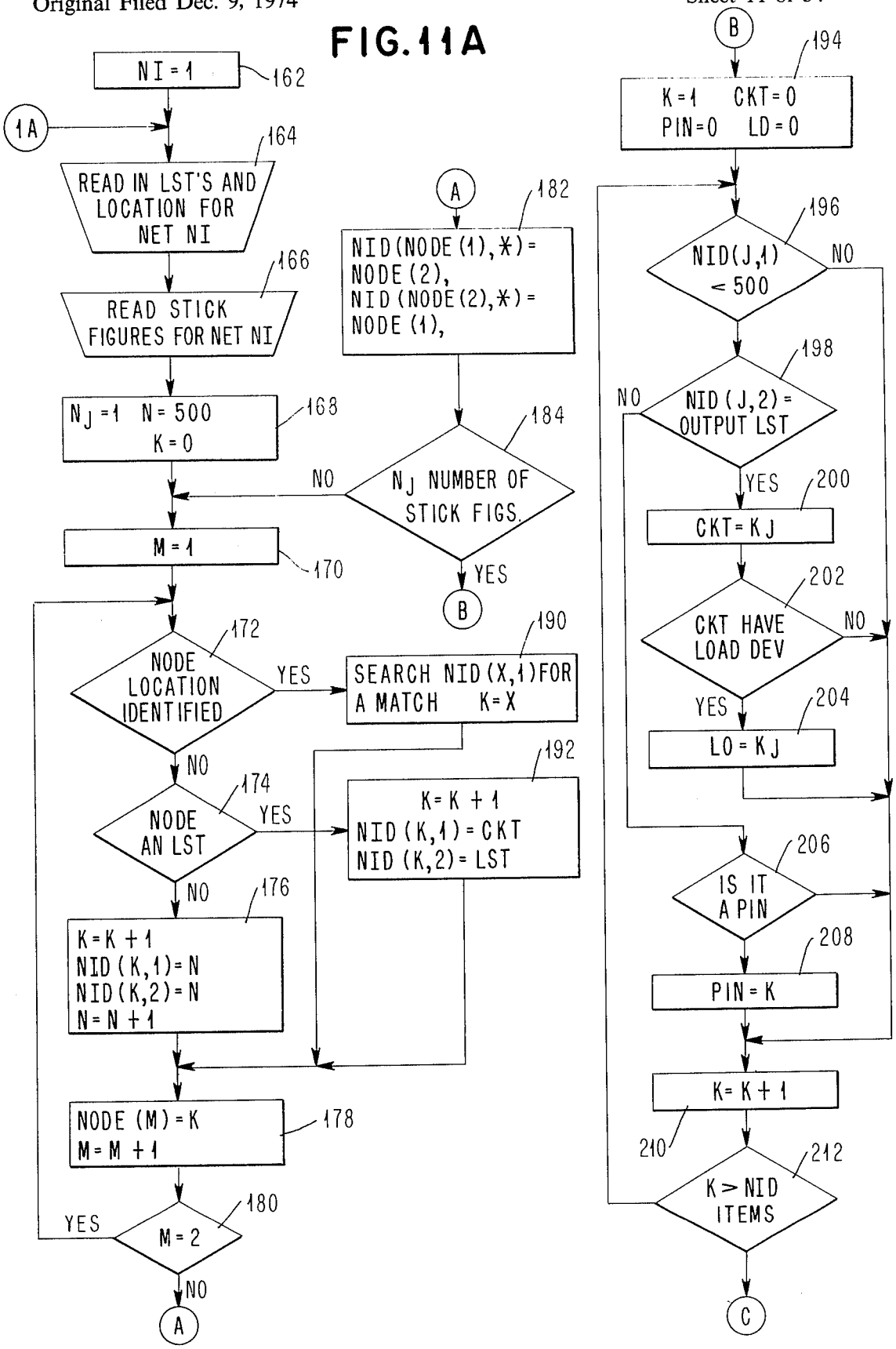

FIG. 11A1
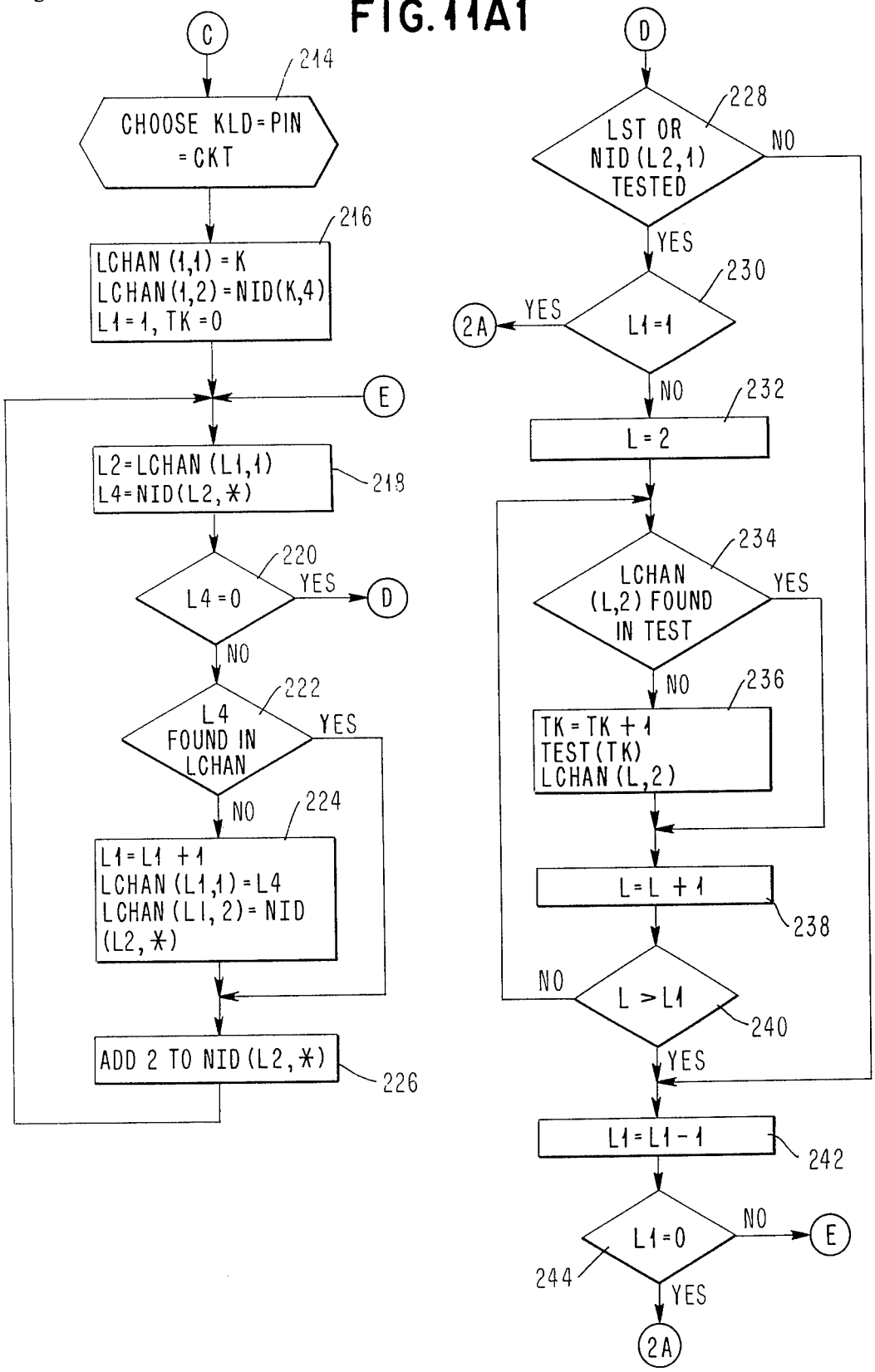

| FIG.11B | FIG.11B-1 |
|---|---|

Figure 11B:
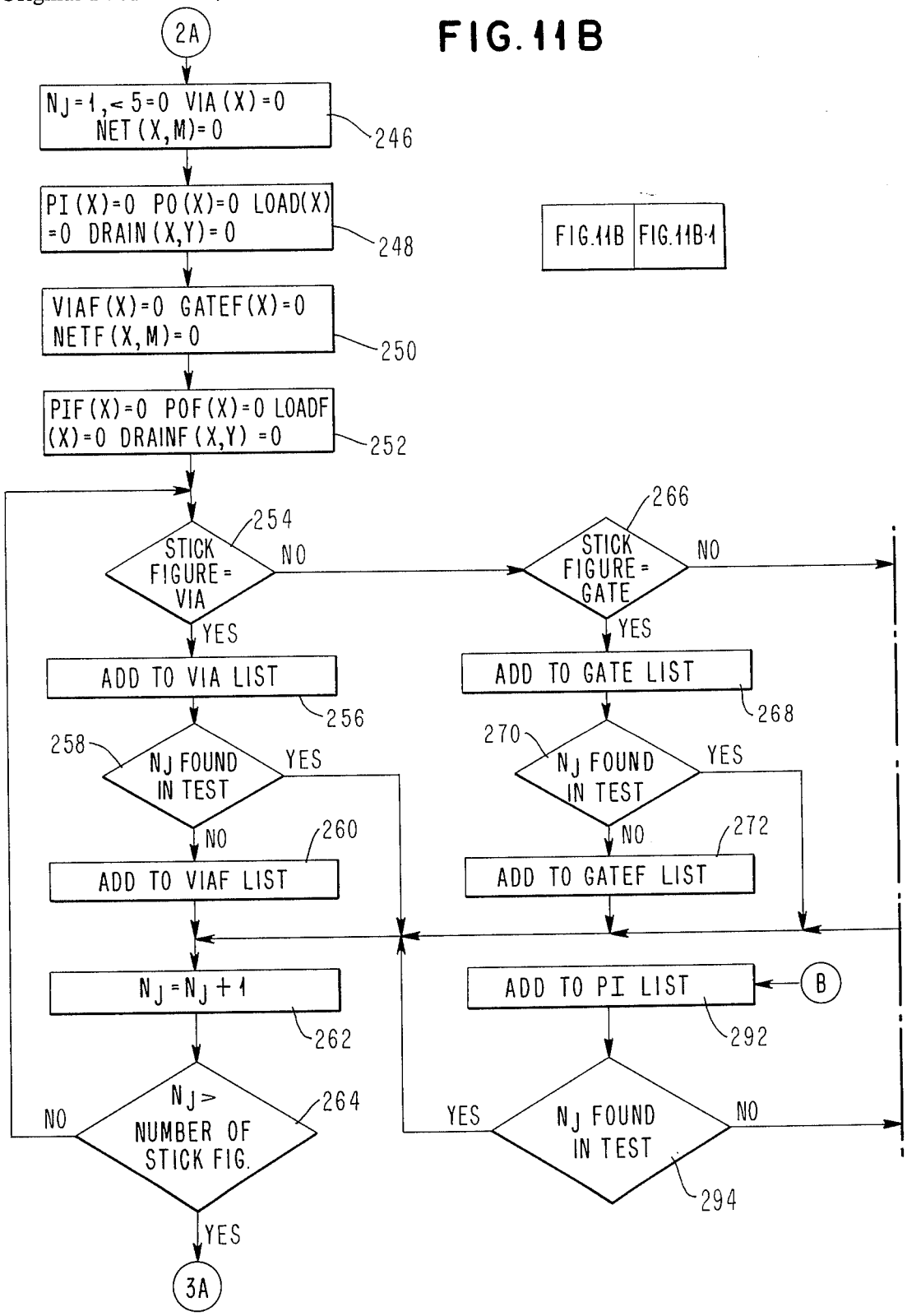

FIG. 11B1
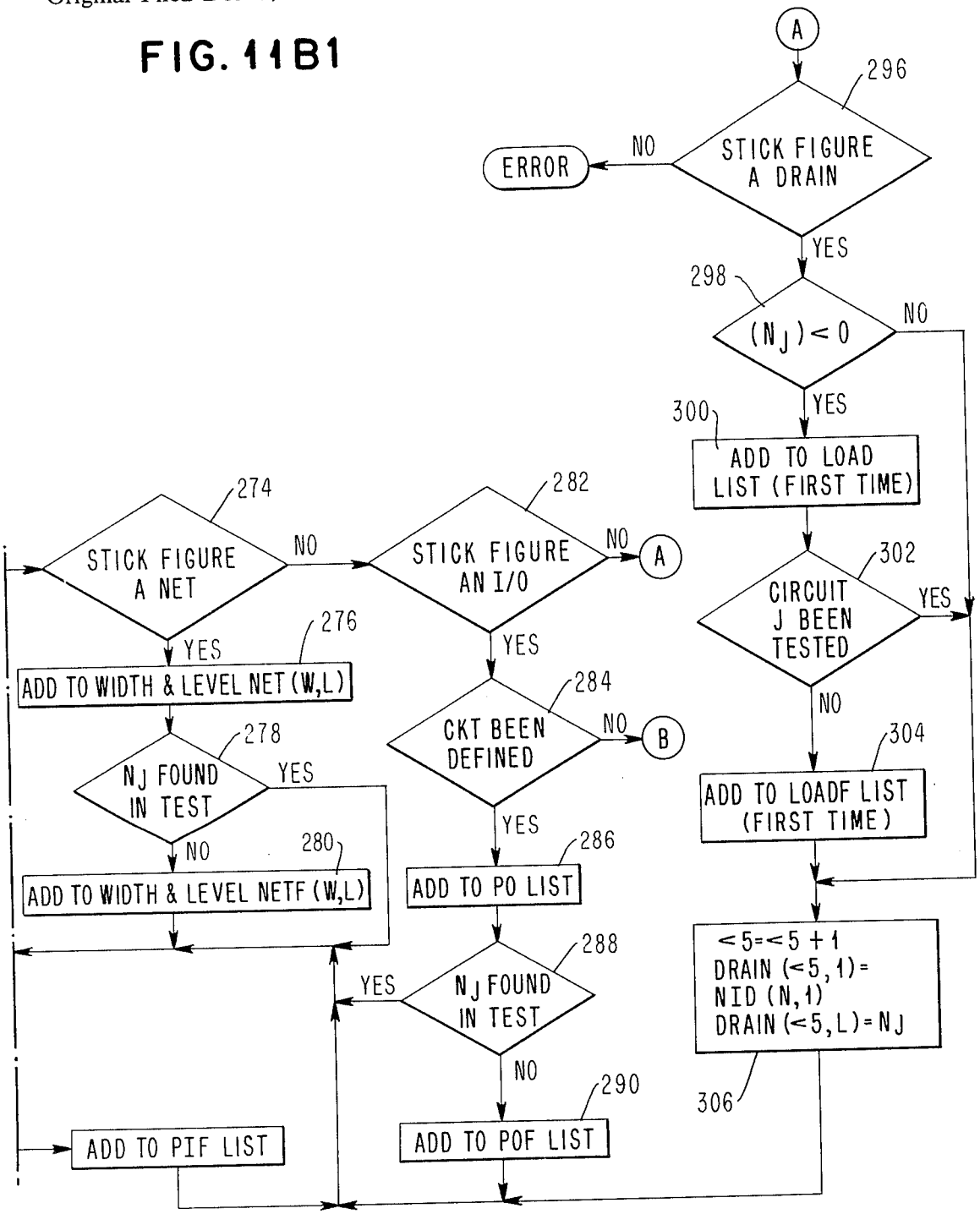

Figure 11C:
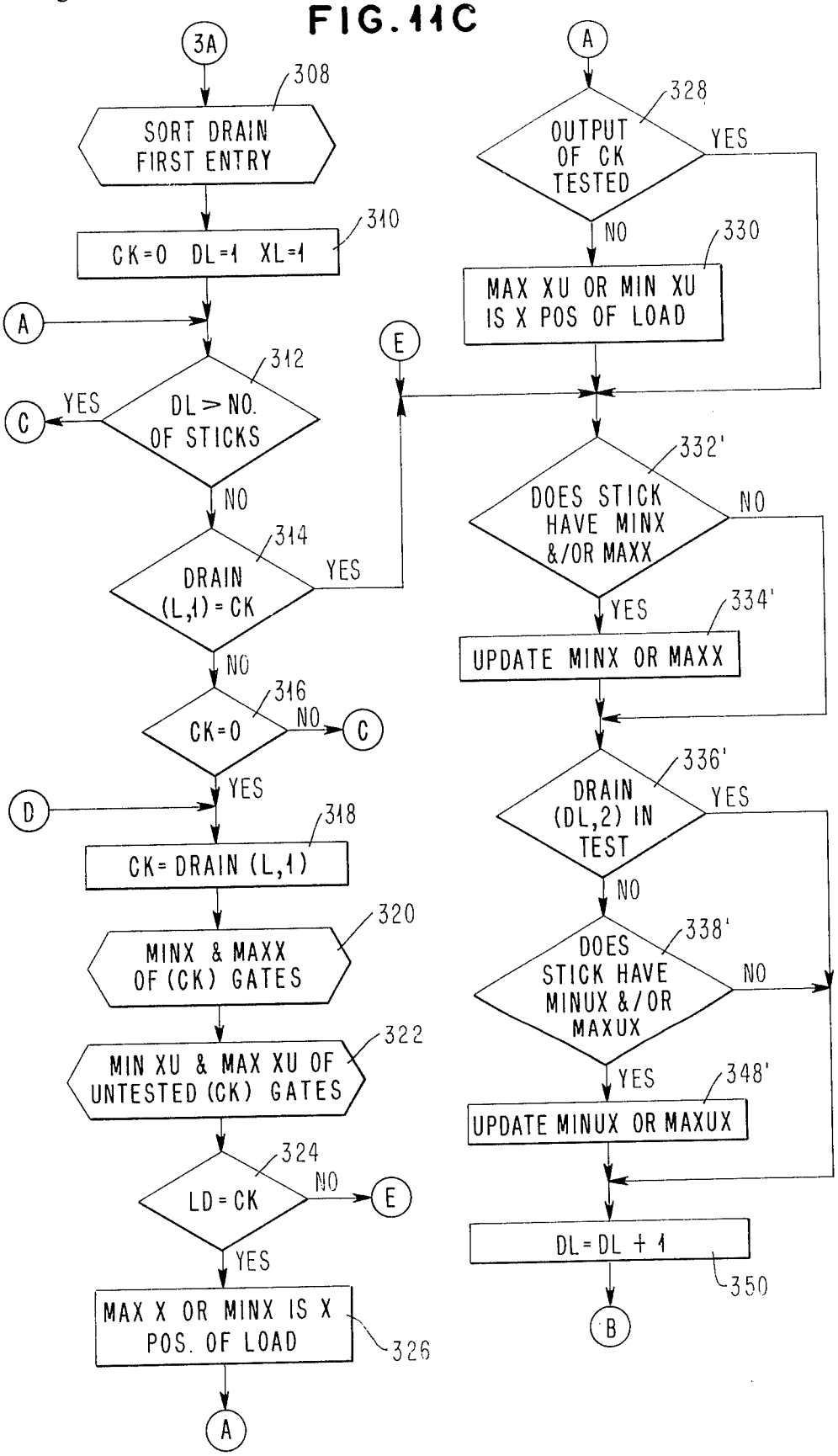
Figures 12A, 12B:
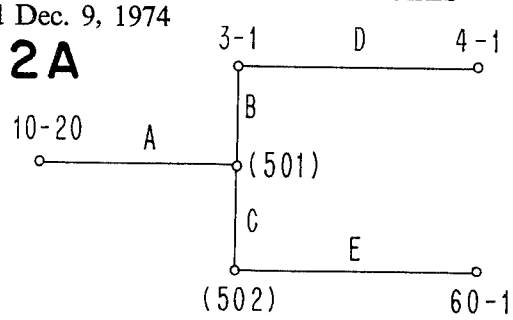

FIG. 11C1
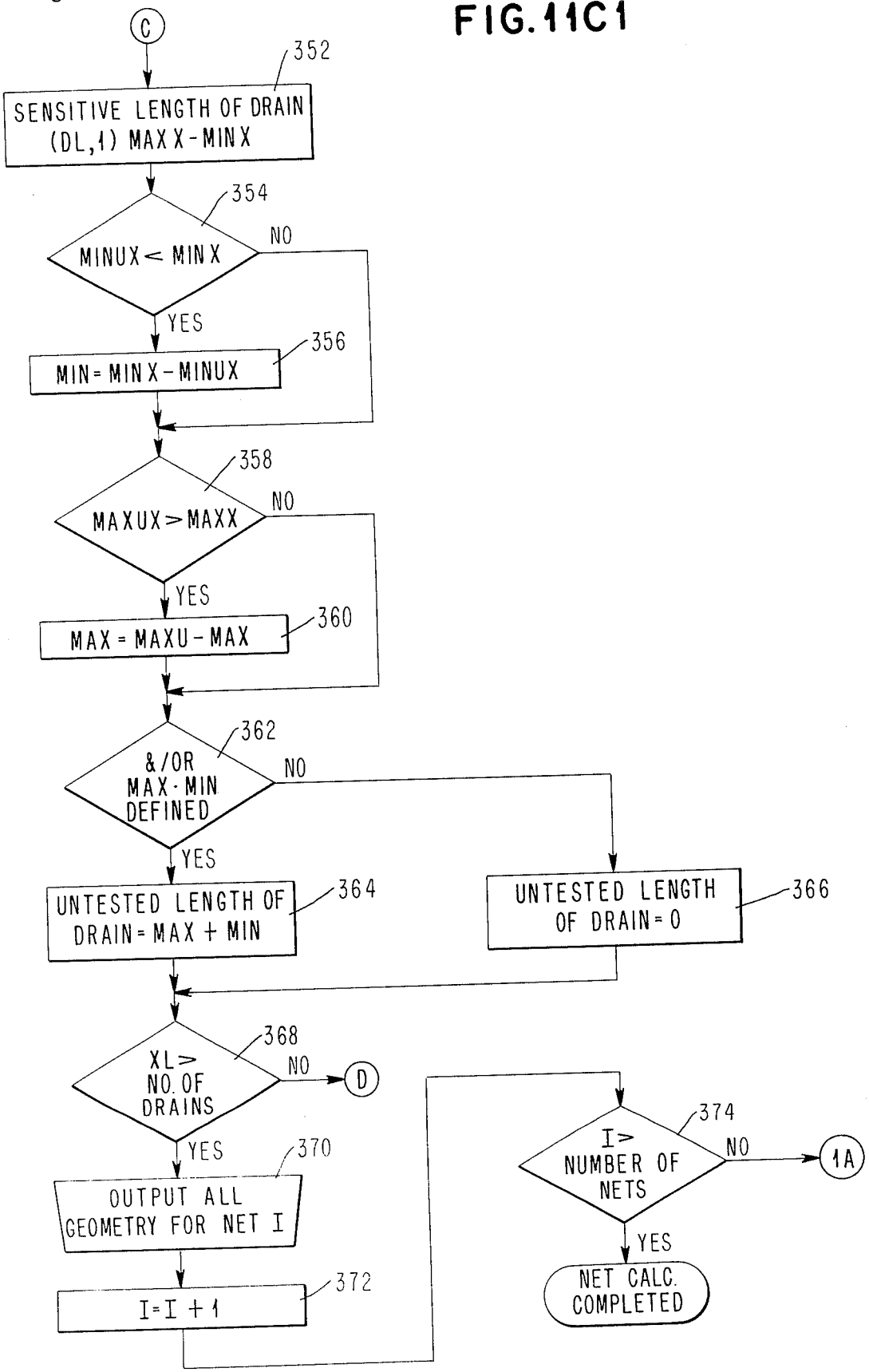

| NID | 1 | 2 | 3 | 4 | 5 | 6 | 7 | 8 | 9 | 10 |
|---|---|---|---|---|---|---|---|---|---|---|
| 1 | 10 | 20 | 2 | A | | | | | | |
| 2 | 501 | 501 | 1 | A | 3 | B | 5 | C | | |
| 3 | 3 | 1 | 2 | B | 4 | D | | | | |
| 4 | 4 | 1 | 3 | D | | | | | | |
| 5 | 502 | 502 | 2 | C | 6 | E | | | | |
| 6 | 60 | 1 | 5 | E | | | | | | |

F

FIG. 12C ASSUME START AT 10-20

LCHAN L1

| | | | |
|---|---|---|---|
| 1 | A | | |
| 2 | A | | |
| 3 | B | 5 | C |
| 4 | D | 6 | E |

FIG. 12D DRAIN TABLE

| | | | | |
|---|---|---|---|---|
| DL | 1 | CKT 10 | STICK | XL=1 |
| | 2 | CKT 10 | STICK | |
| | 3 | CKT 10 | STICK | |
| DL | 1 | CKT 20 | STICK | XL=2 |
| | 2 | CKT 20 | STICK | |
| DL | 1 | CKT 30 | STICK | XL=3 |

XL= NUMBER OF DRAINS

Figure 13A:
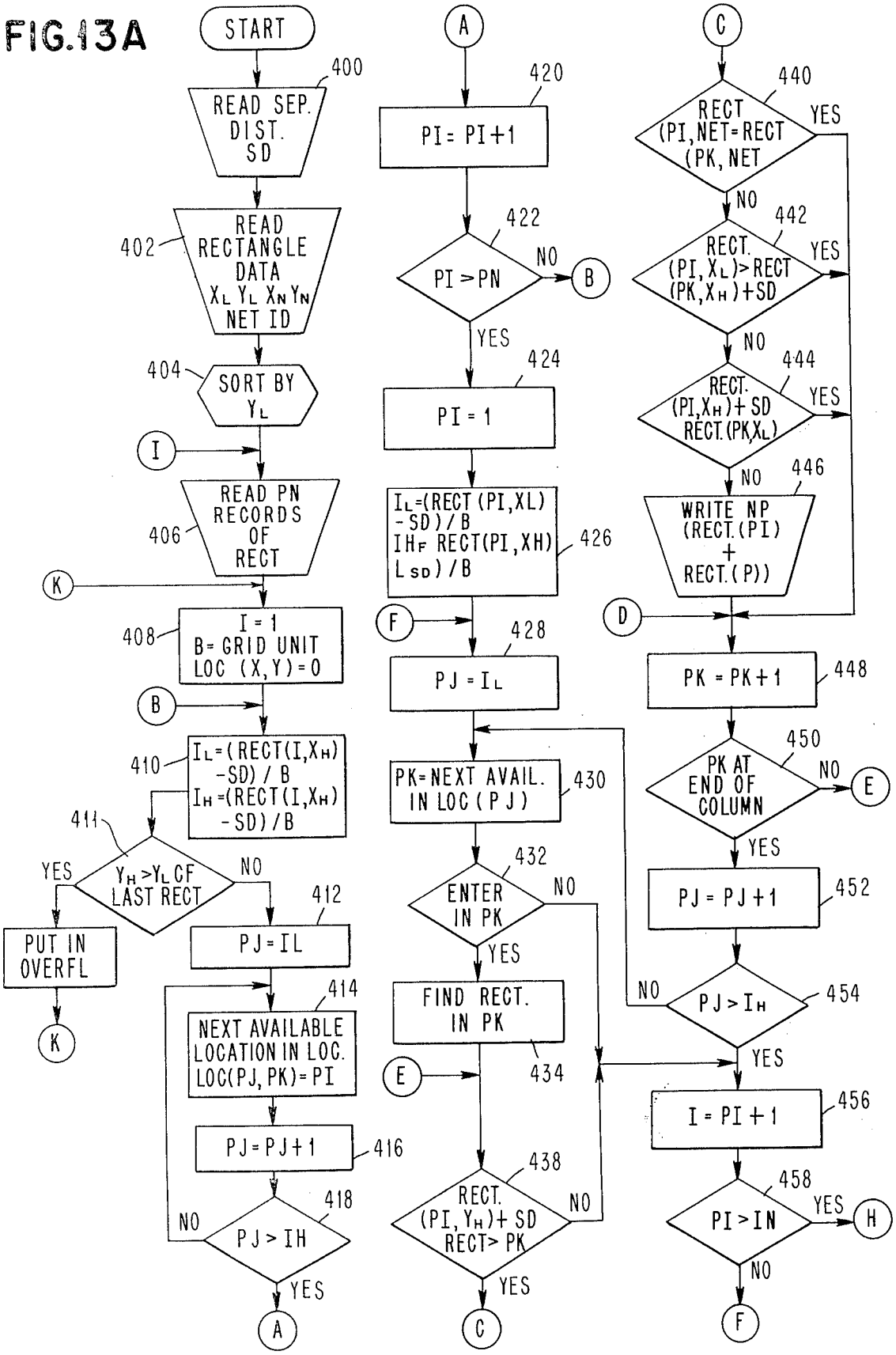
Figure 14A:
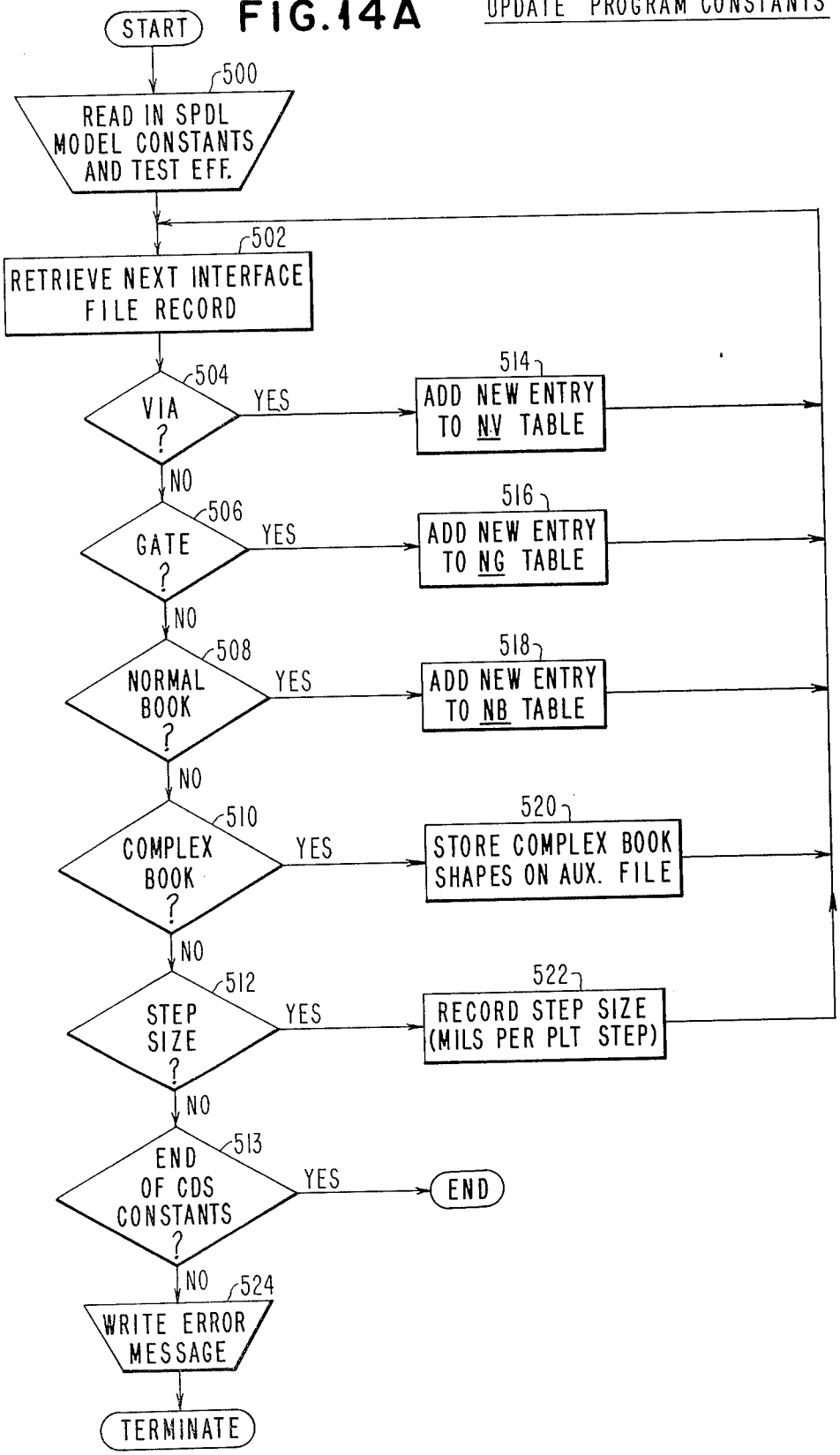
Figure 14B:
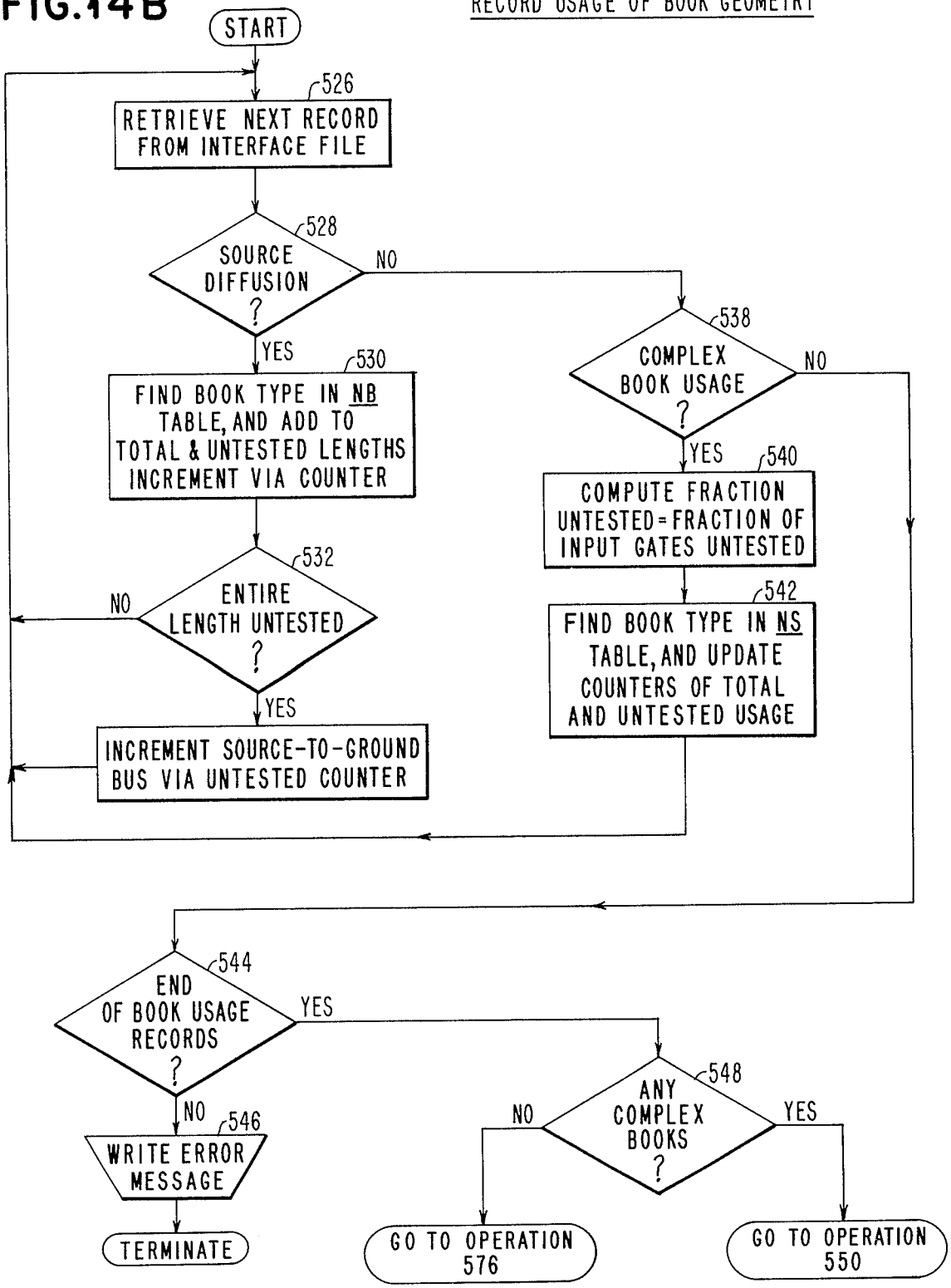
Figure 15:
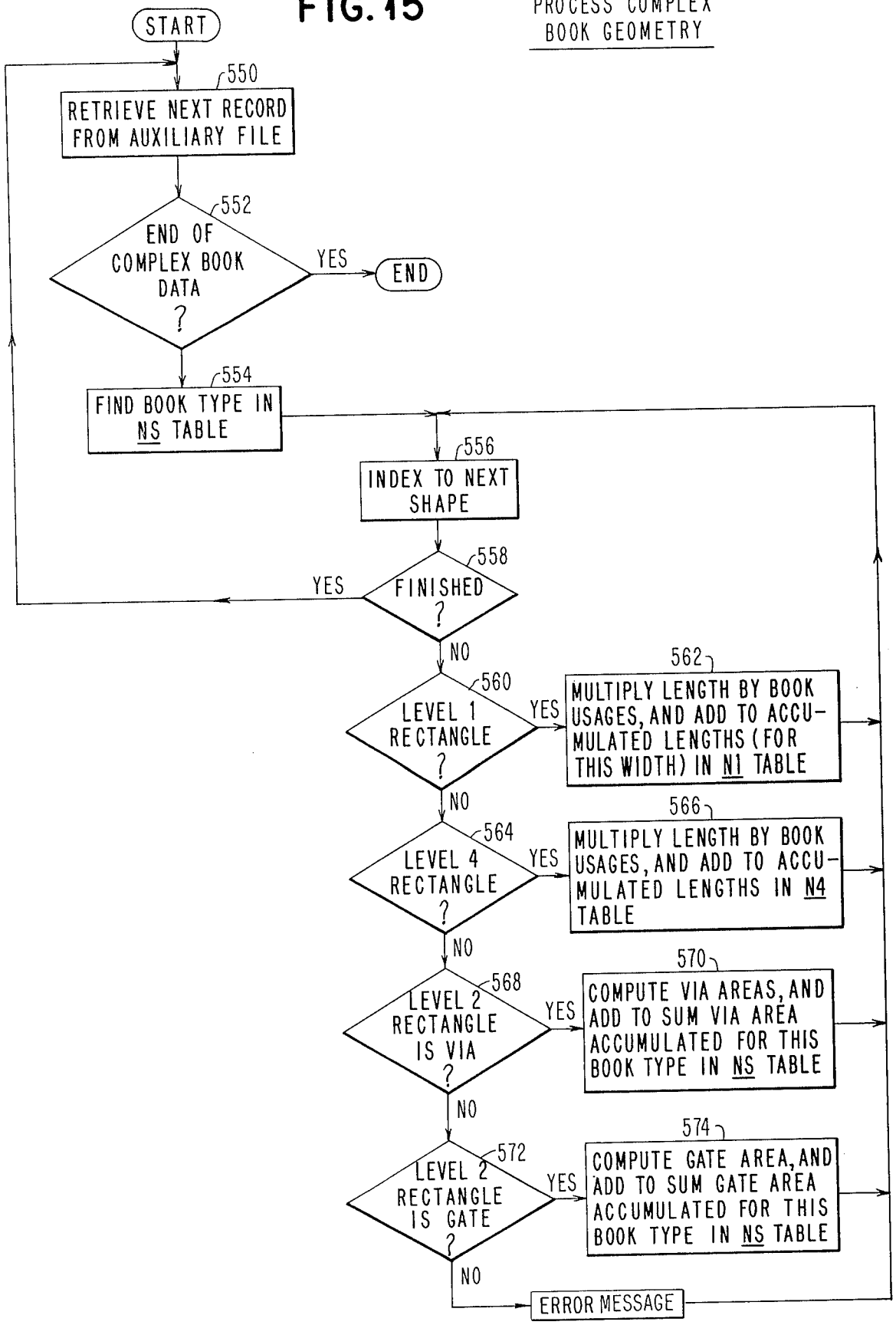
Figure 16A:
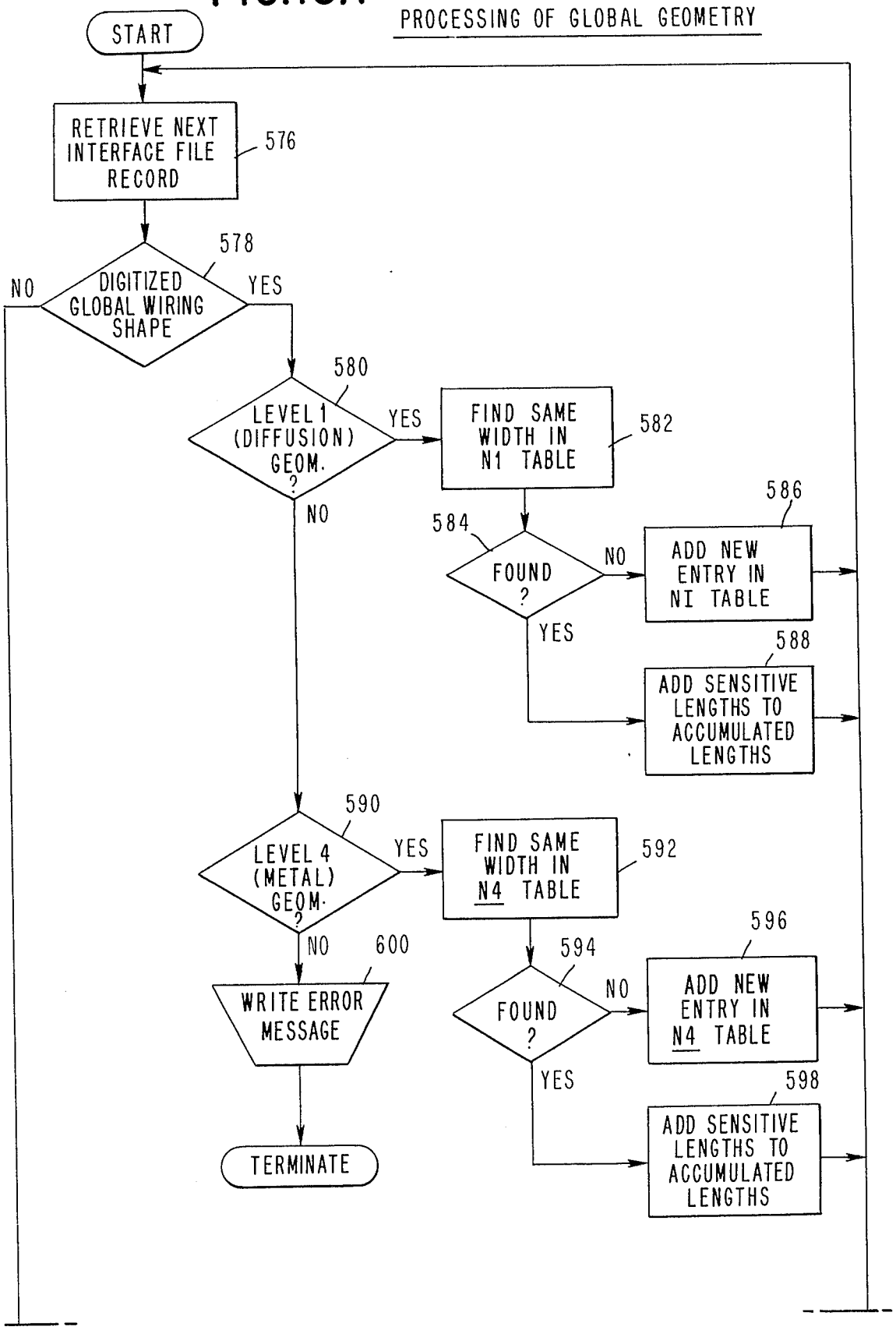
Figure 16B:
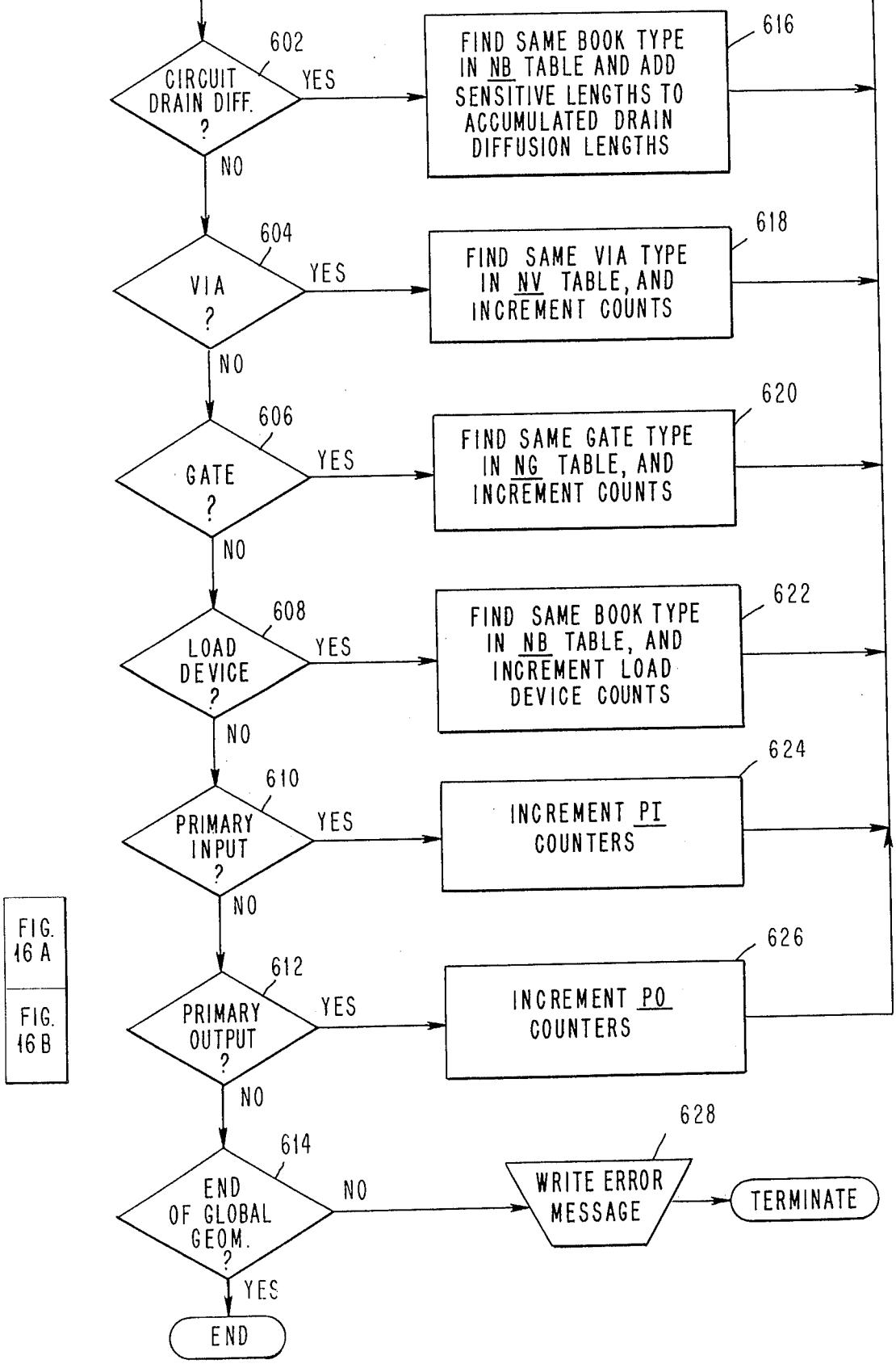
Figure 17:
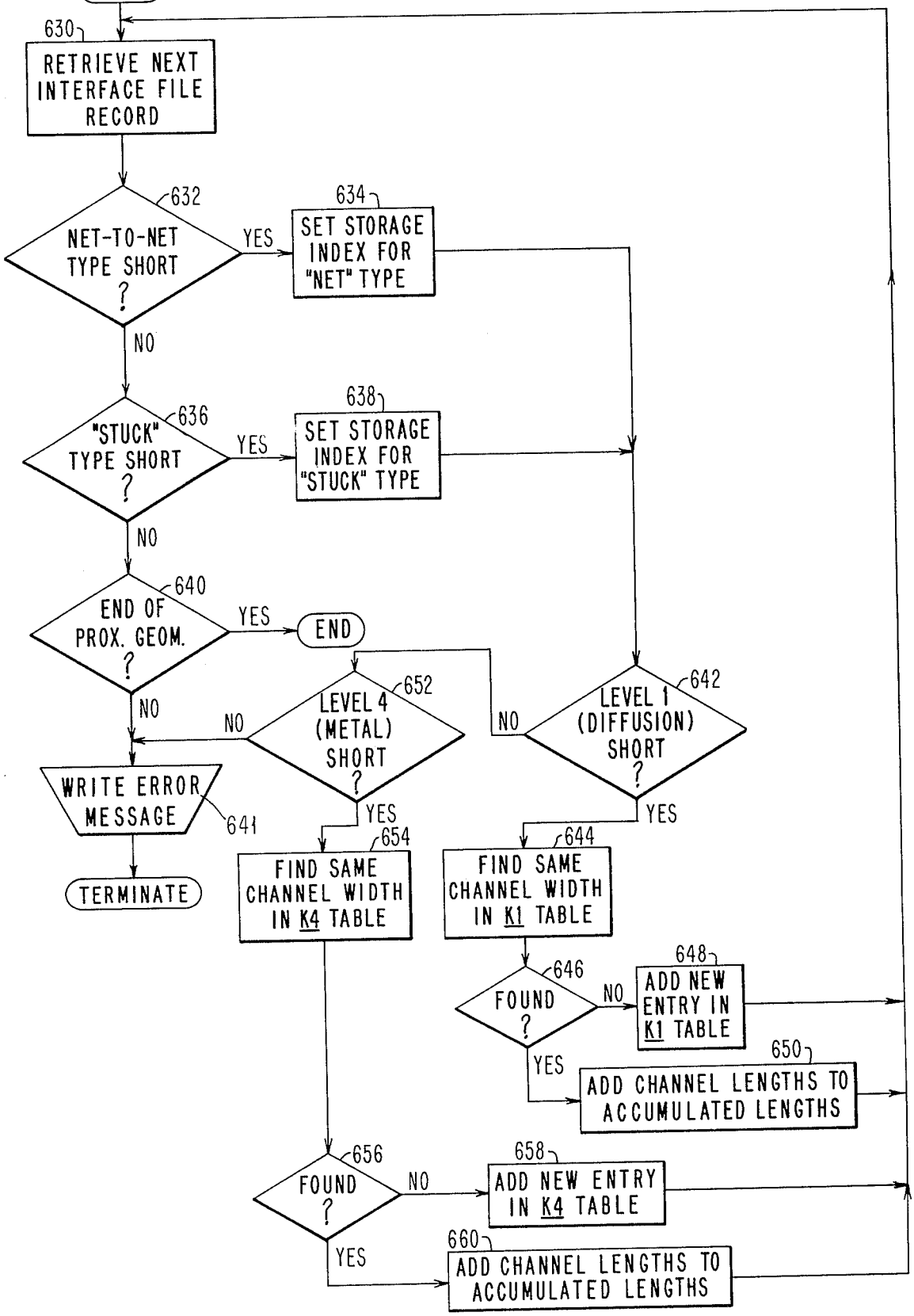

FIG.13A1
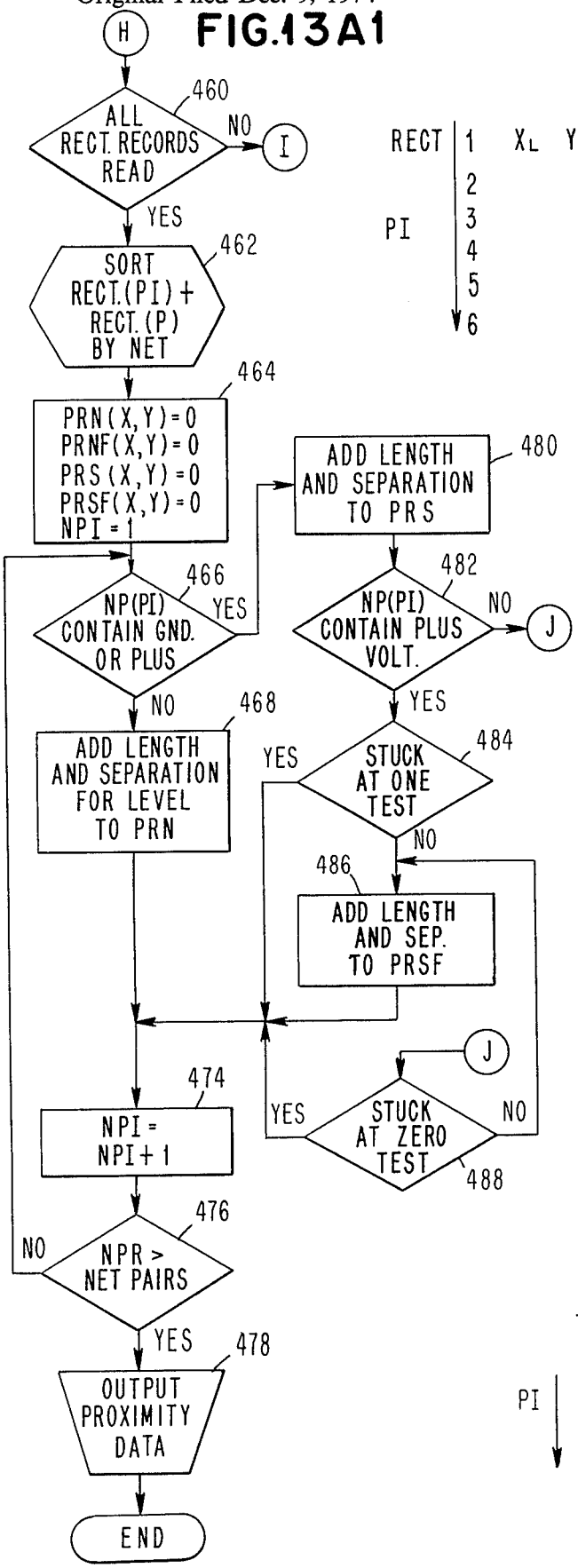
FIG.13B
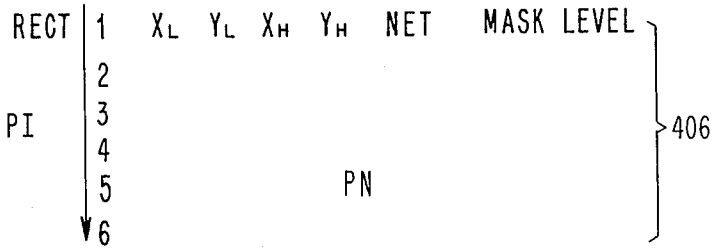
FIG.13C
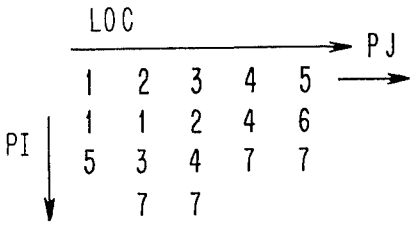

UPDATE PROGRAM CONSTANTS

RECORD USAGE OF BOOK GEOMETRY

PROCESS COMPLEX BOOK GEOMETRY

PROCESS PROXIMITY GEOMETRY

Figure 18A:
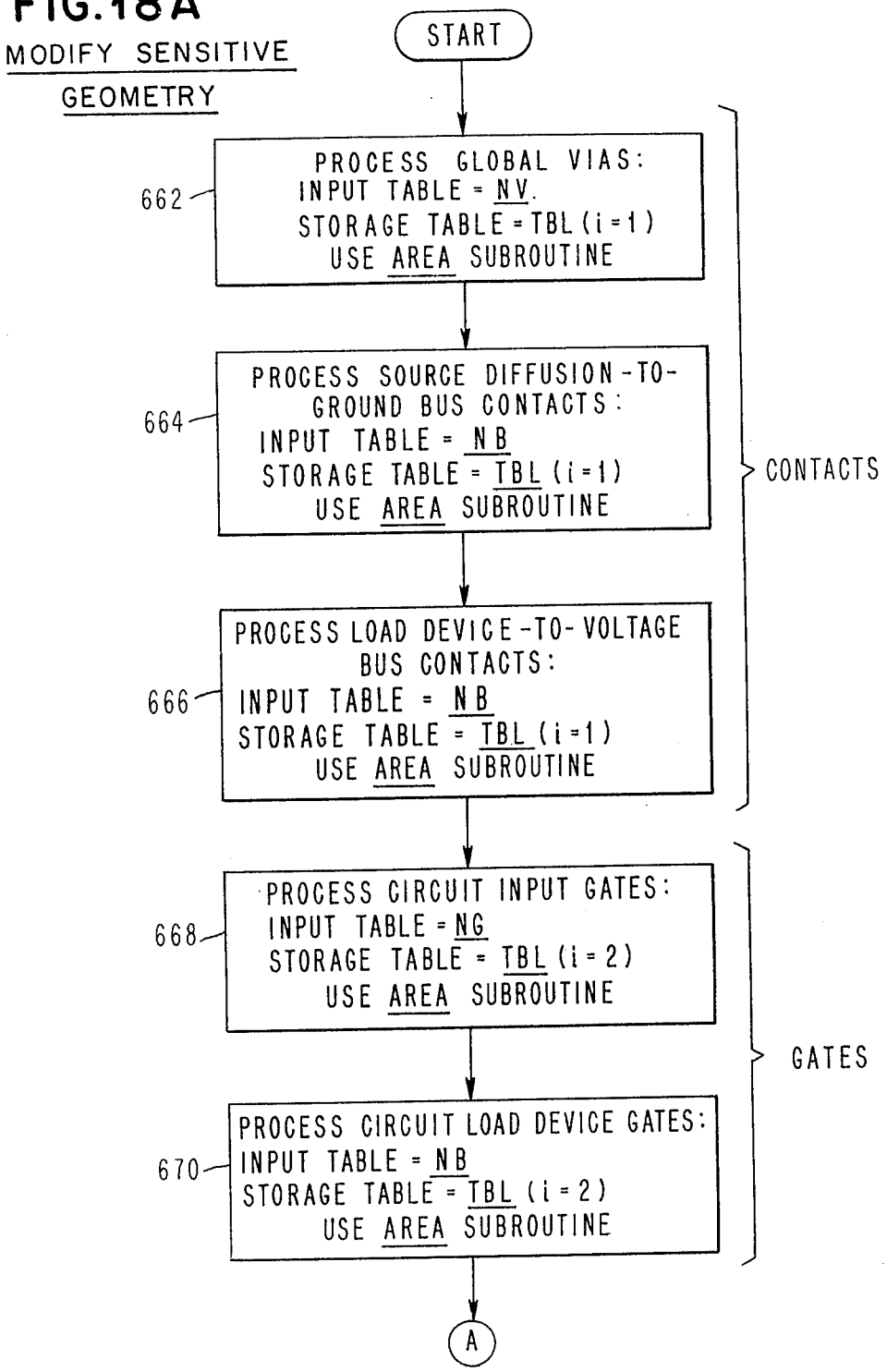
Figure 19:
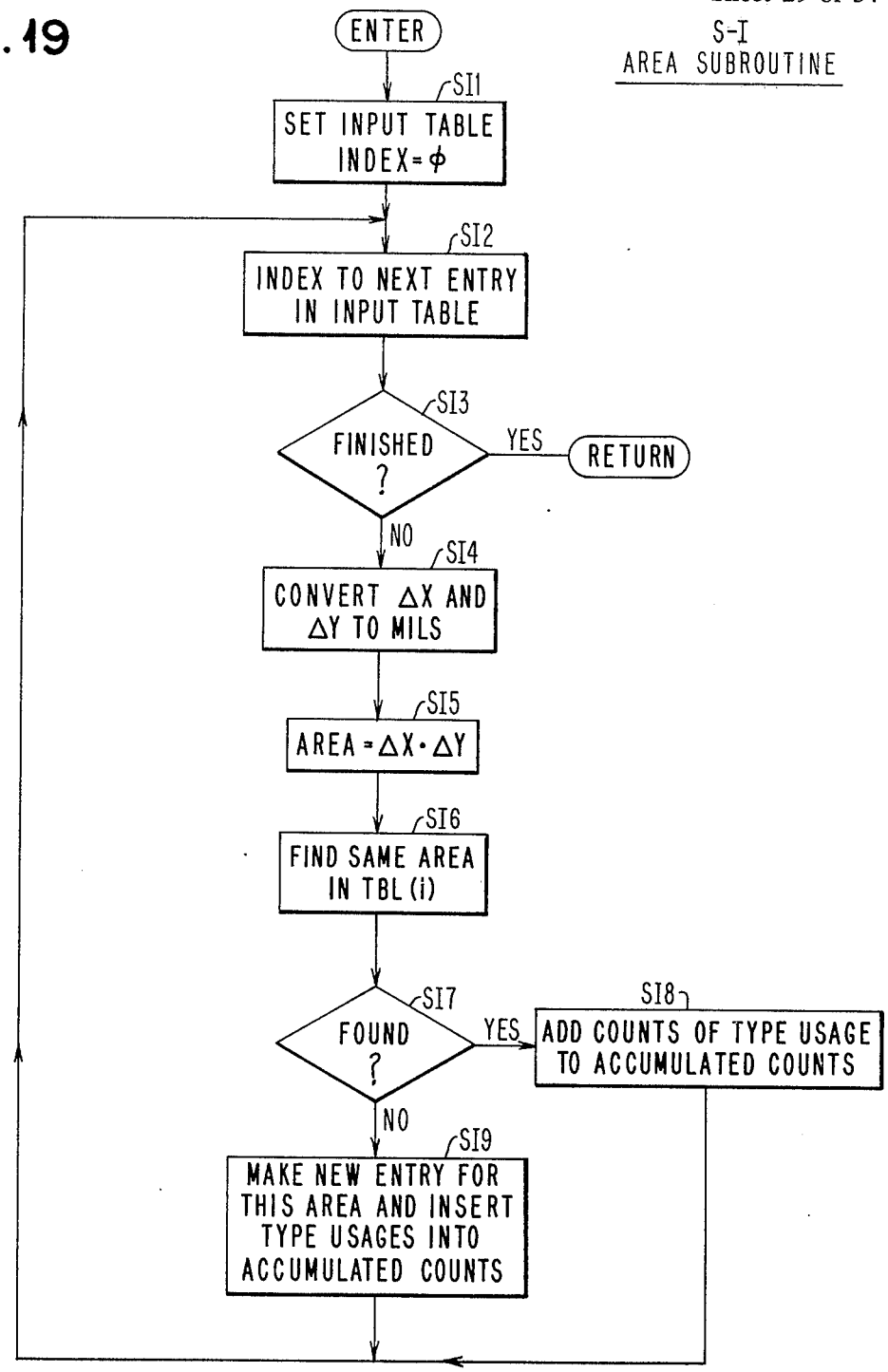
Figure 20:
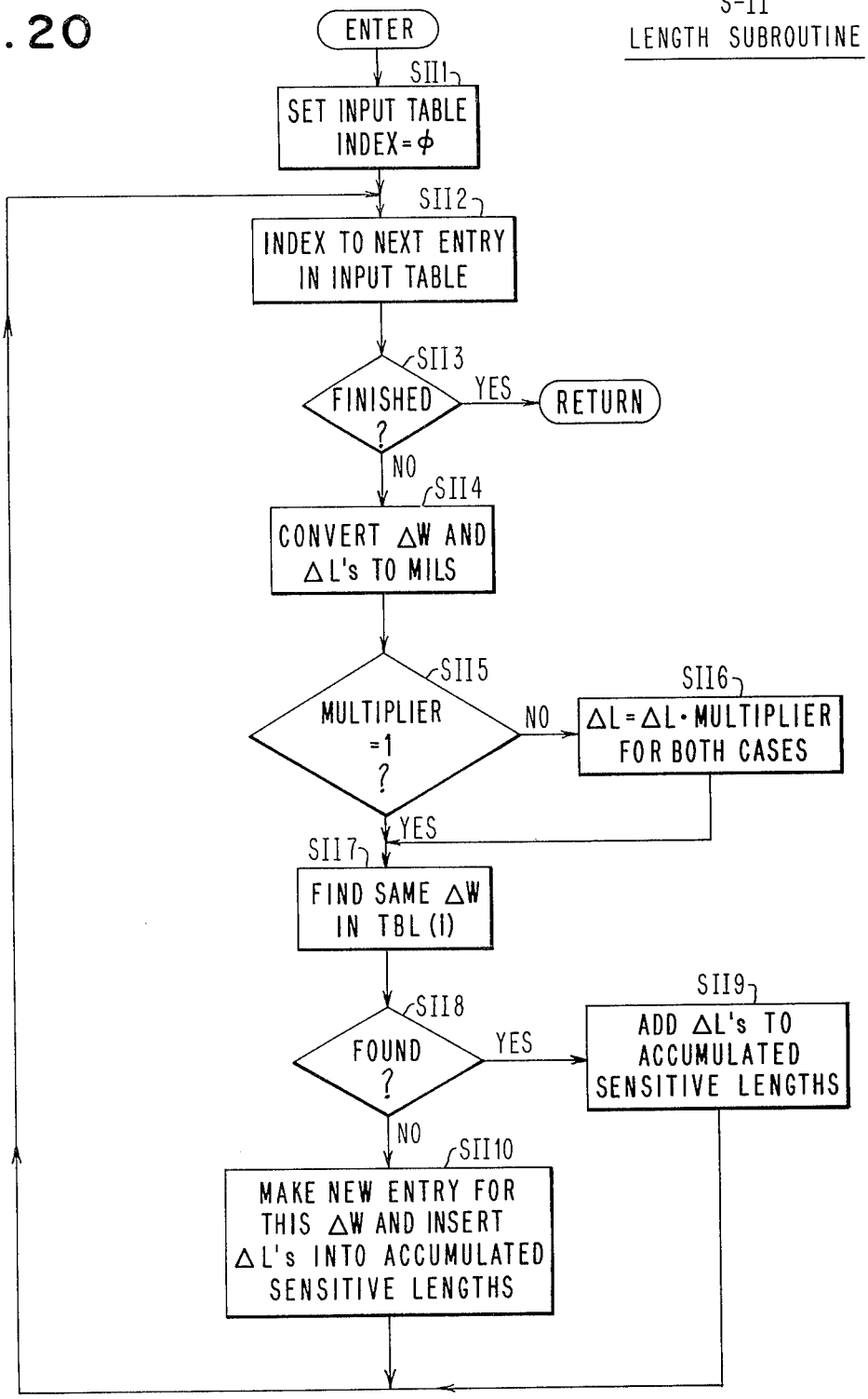
Figure 21:
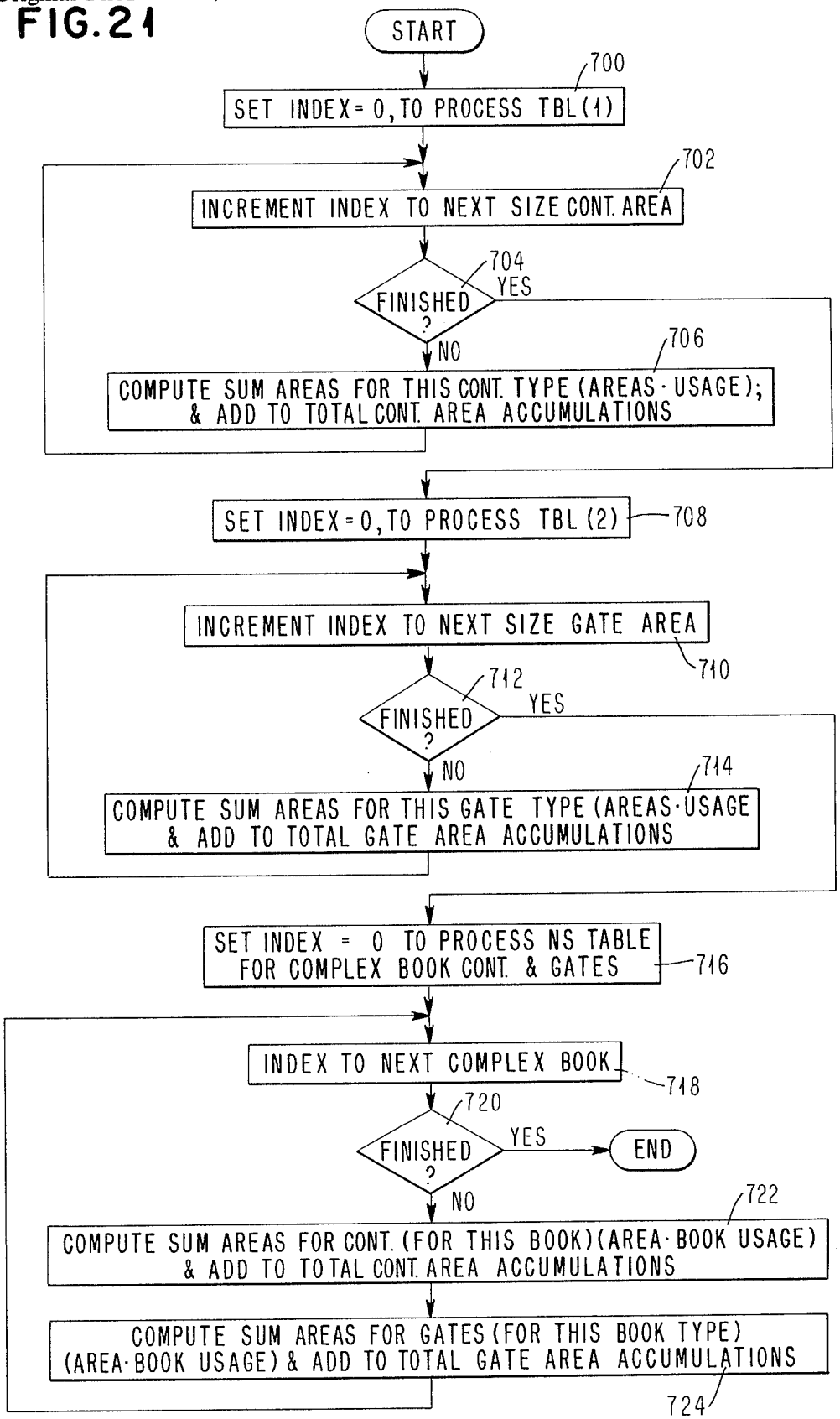
Figures 22A, 22B:
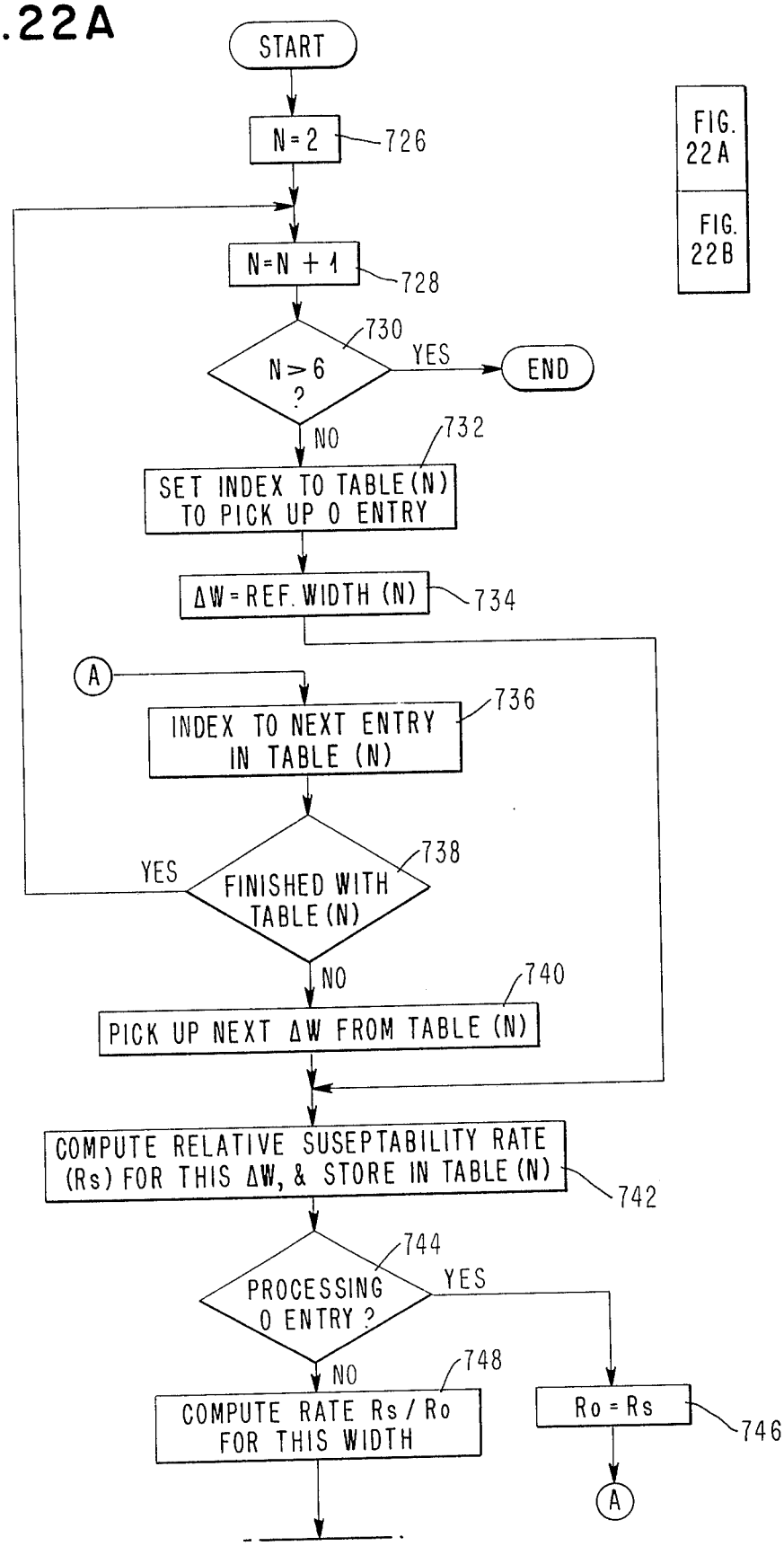
Figure 22B:
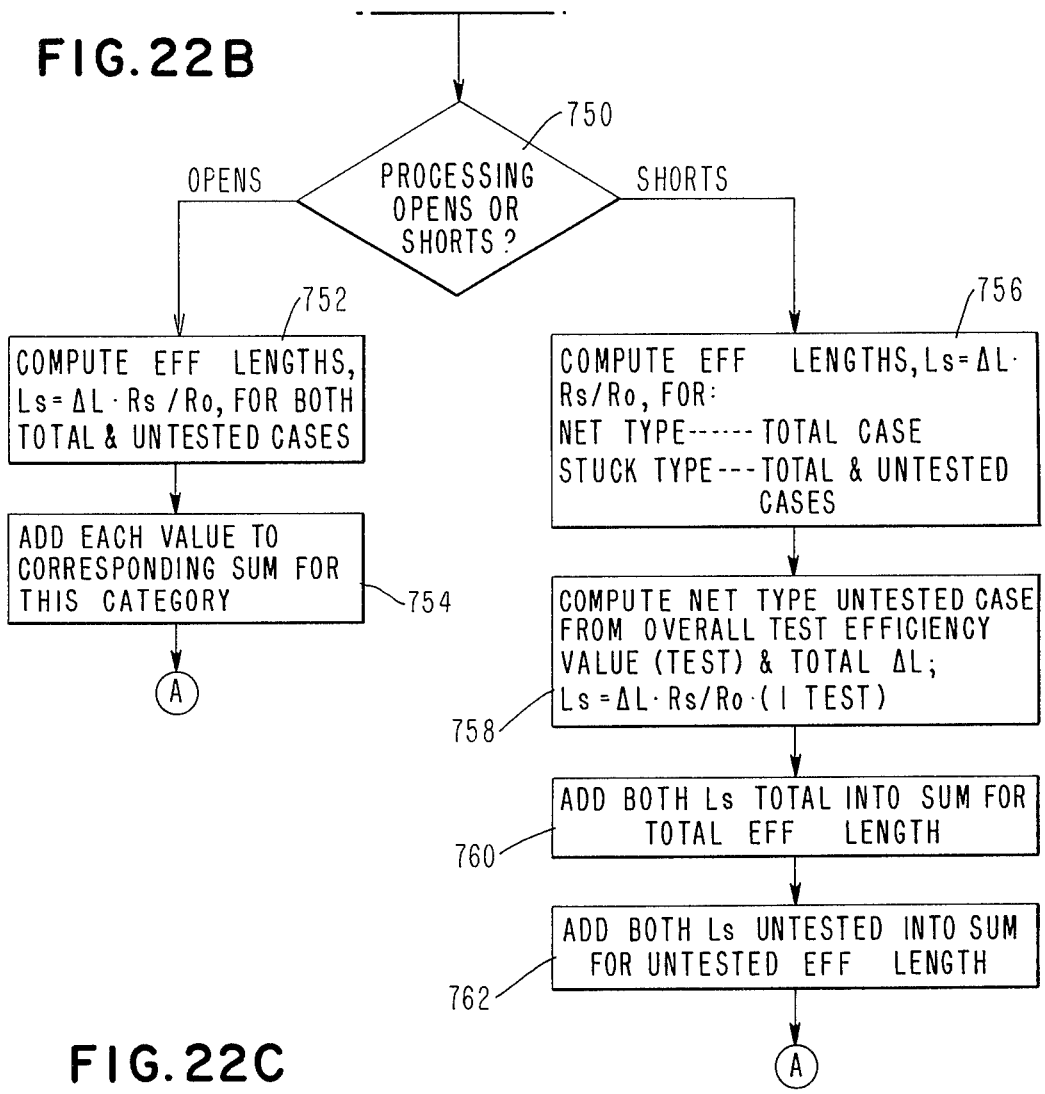
Figure 22C:
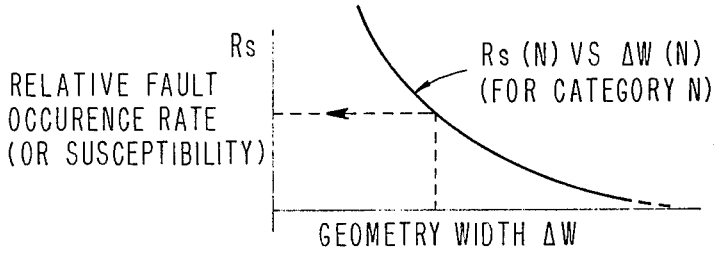
Figure 23:
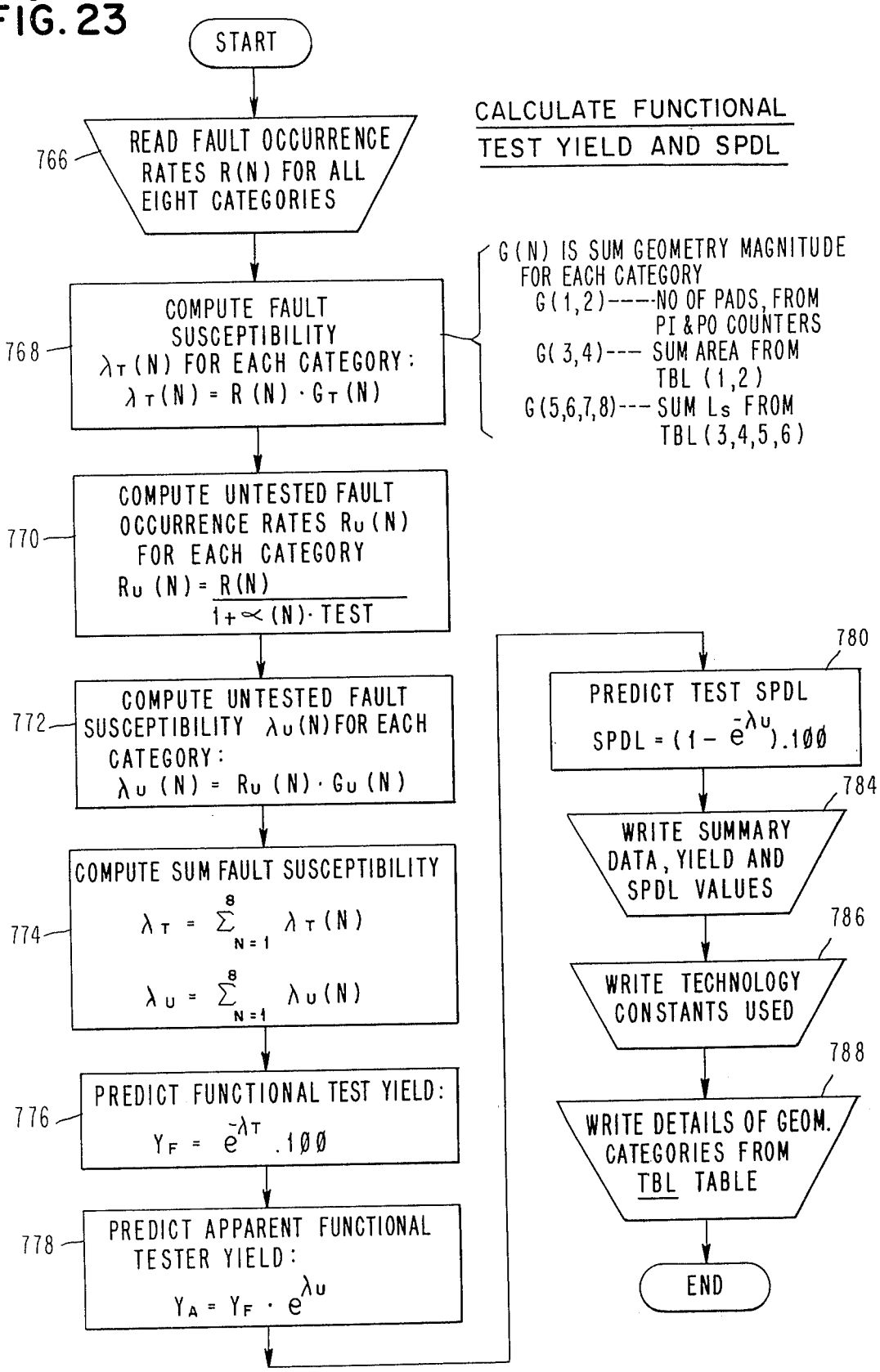

FIG.18A1
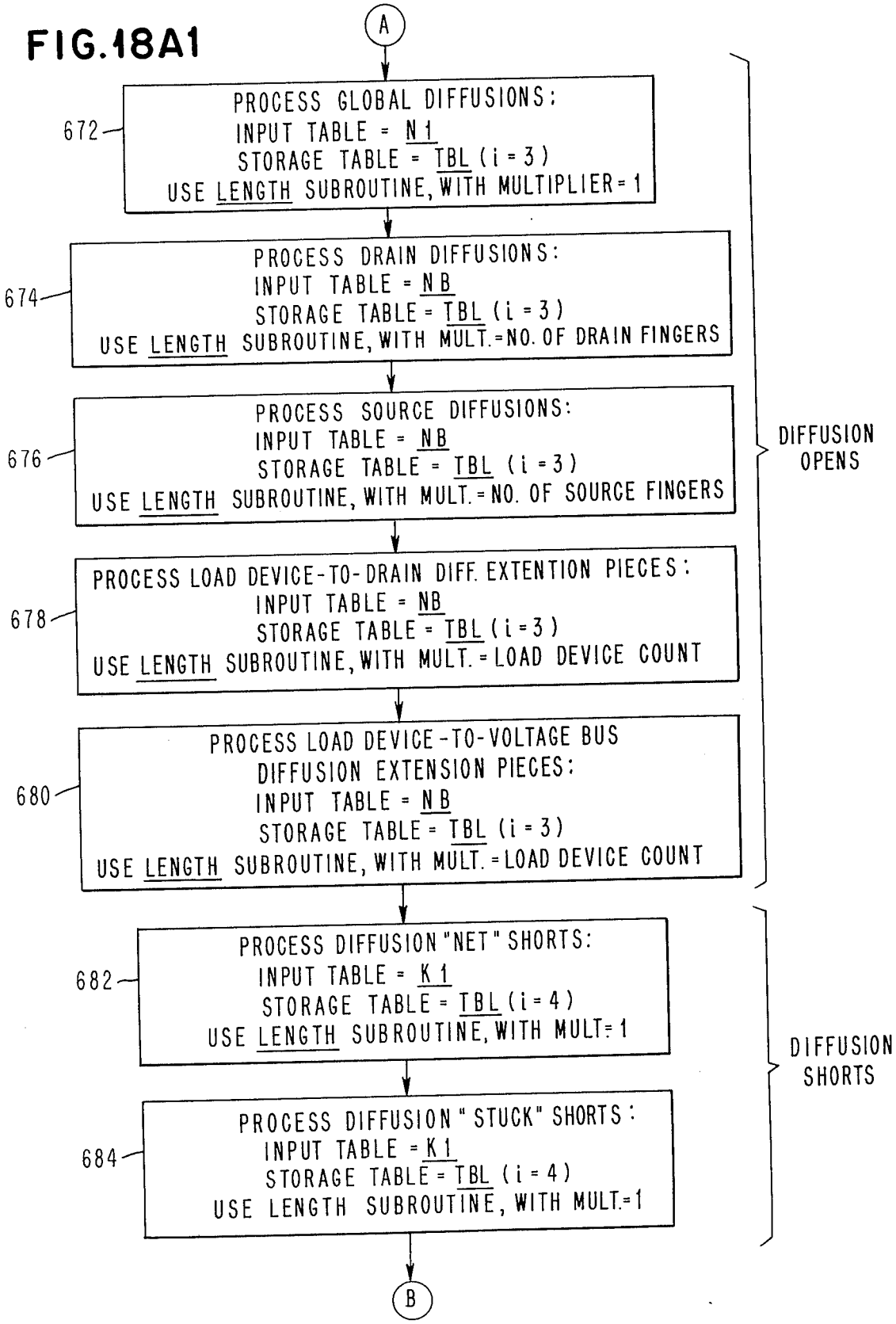

Figure 2:
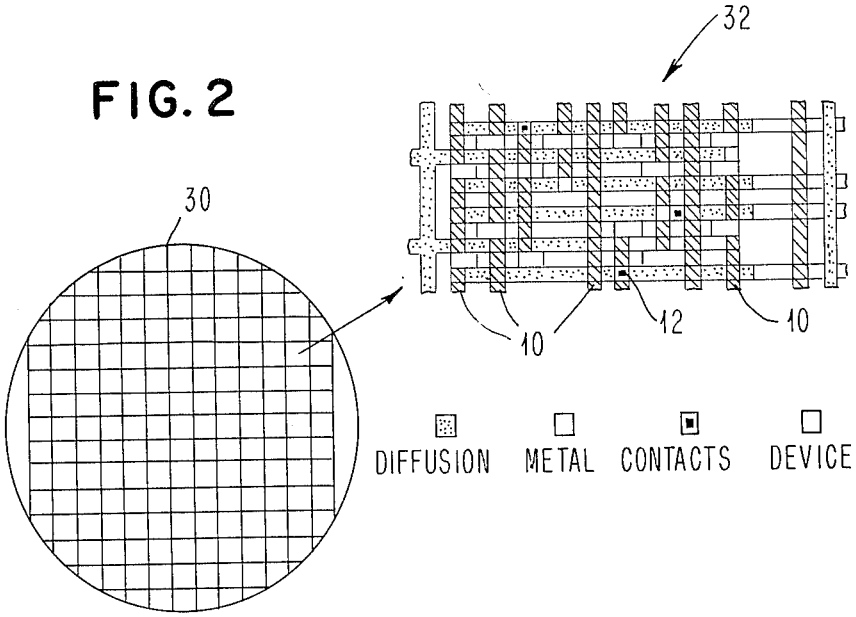
Figure 3:
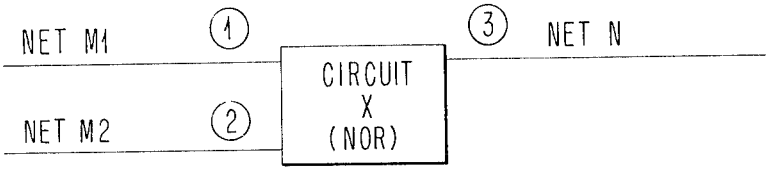
Figure 4:
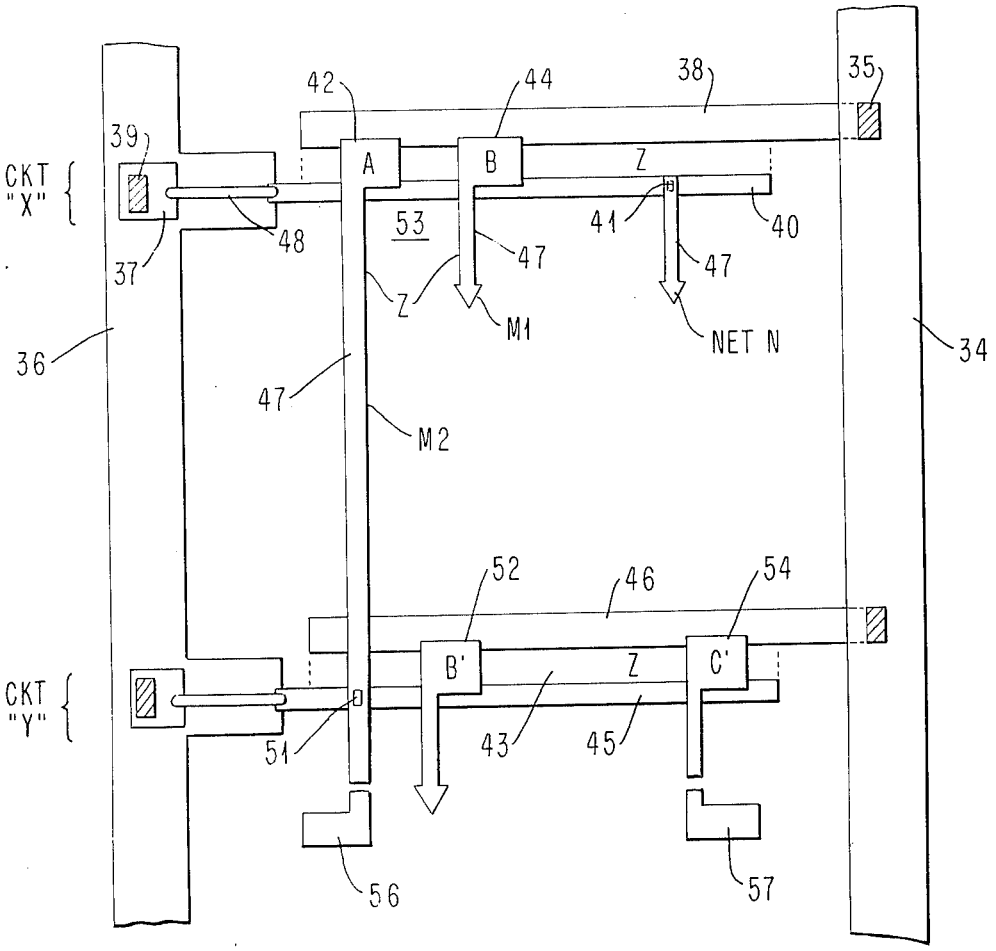
Figure 5A:
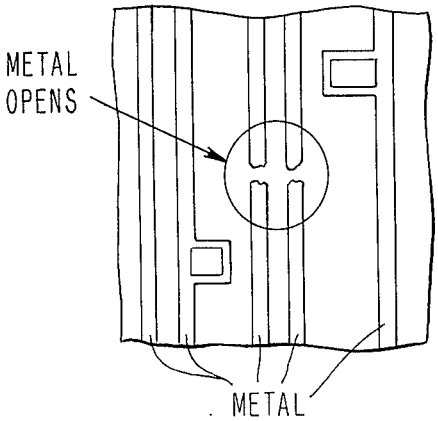
Figure 5B:
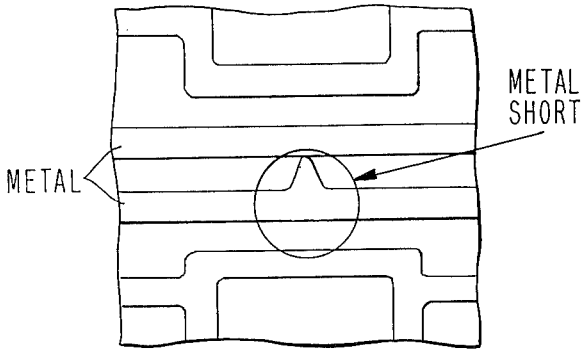
Figure 5C:
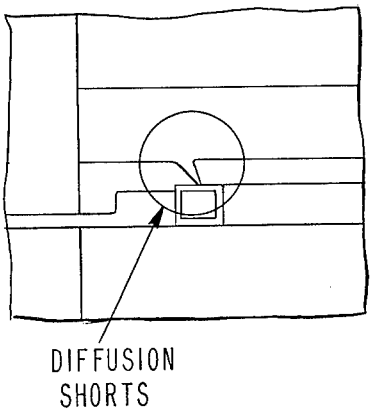
Figure 5D:
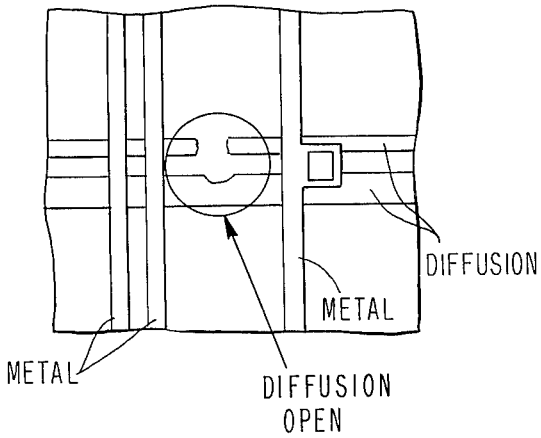
Figure 5E:
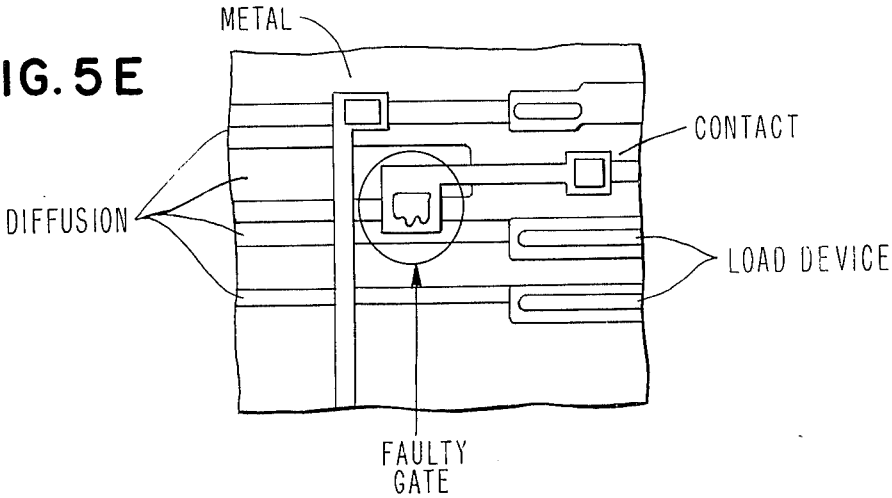
Figure 6:
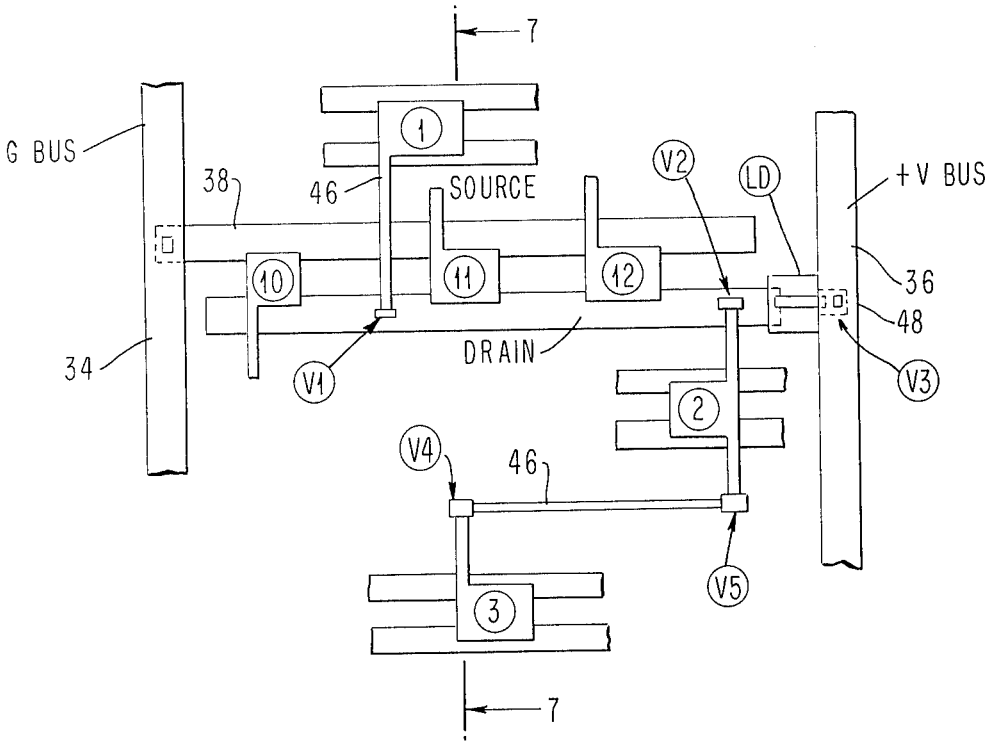
Figure 7:
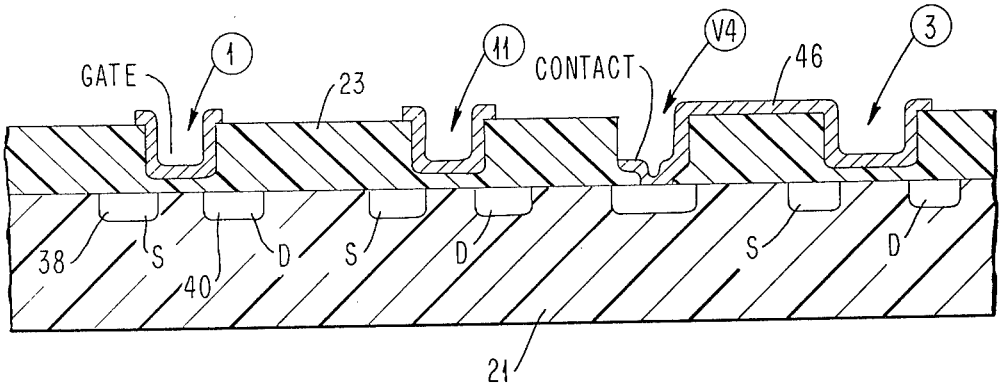
Figure 8A:
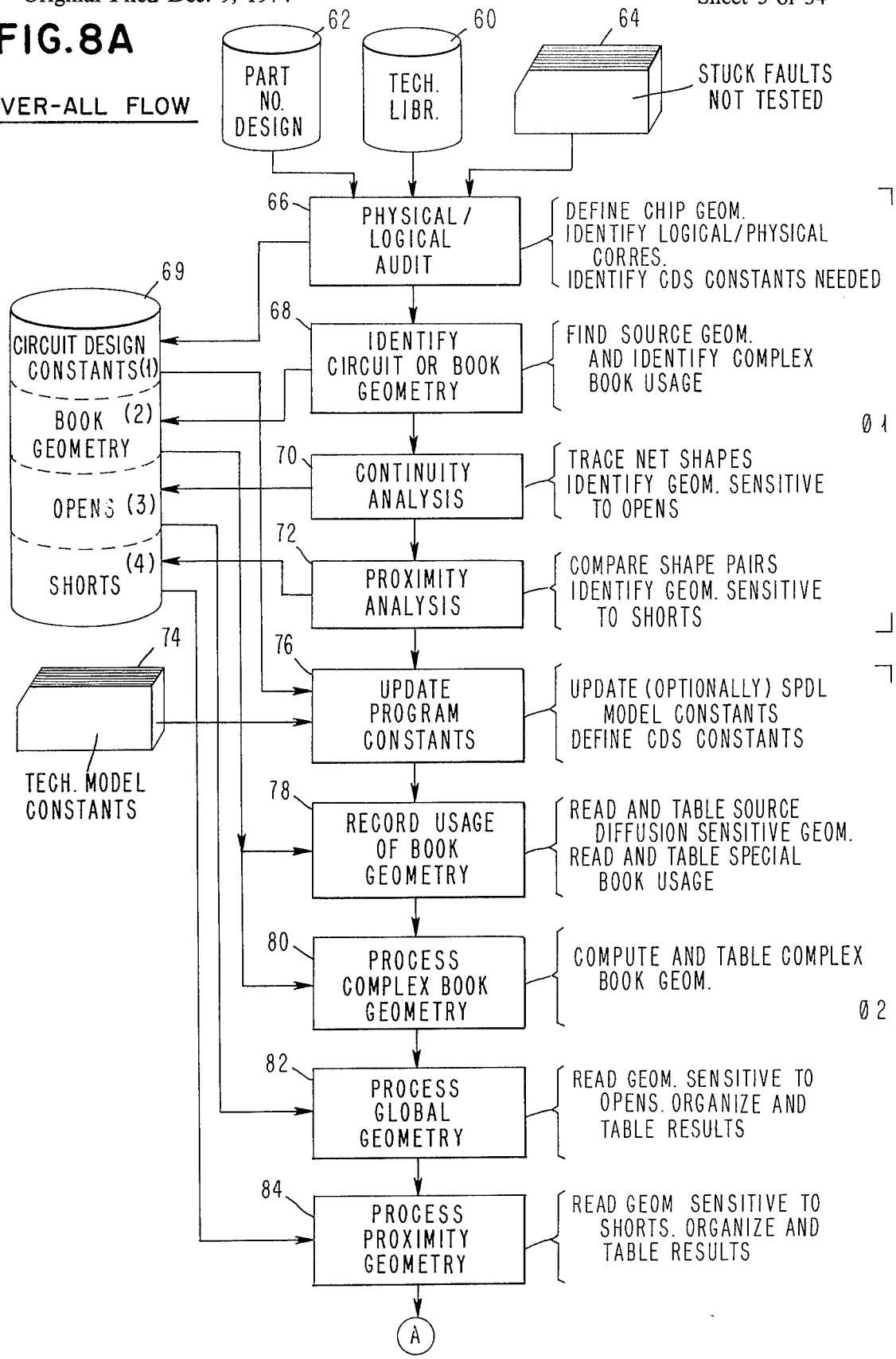
Figure 8B:
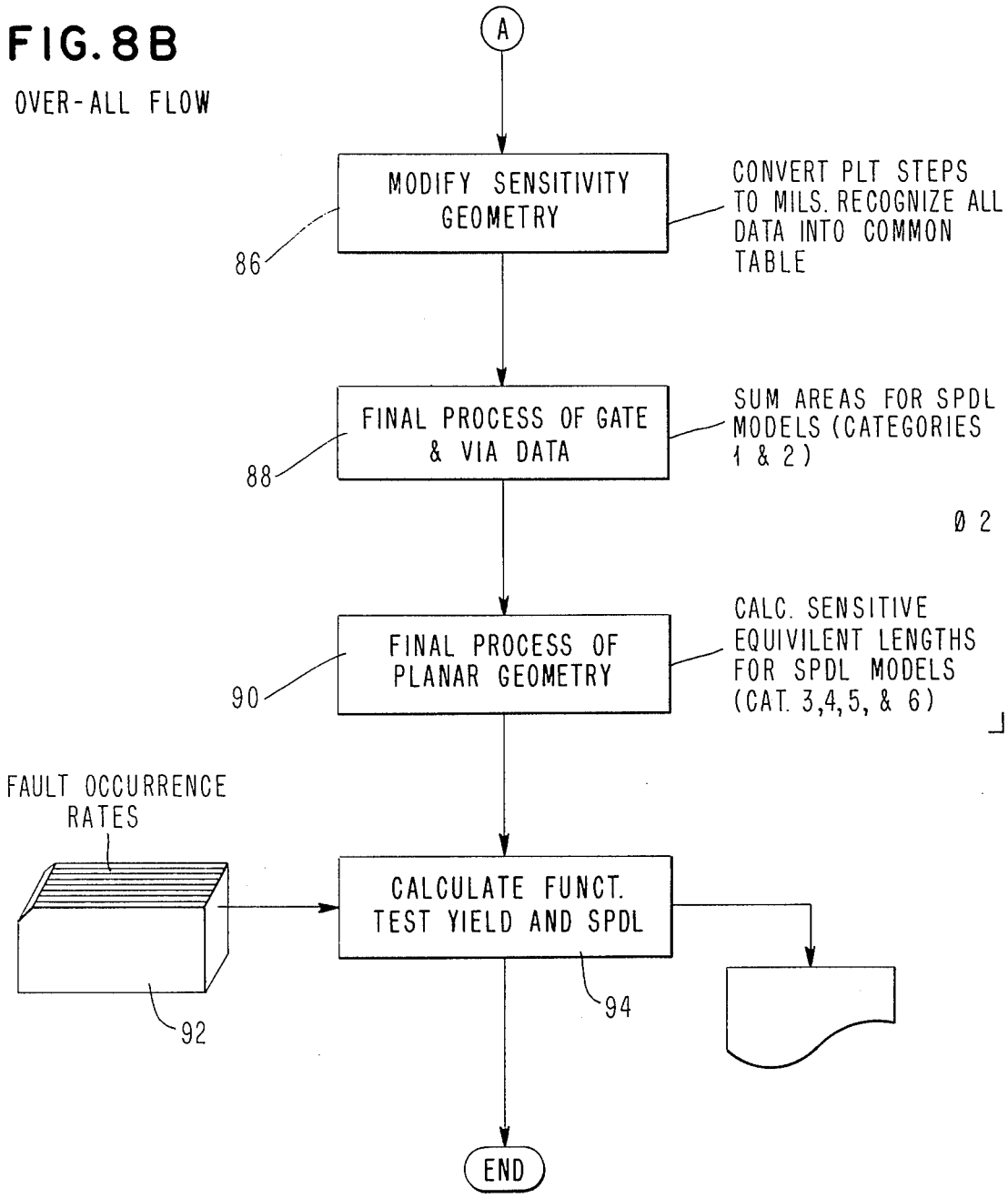
Figure 10A:
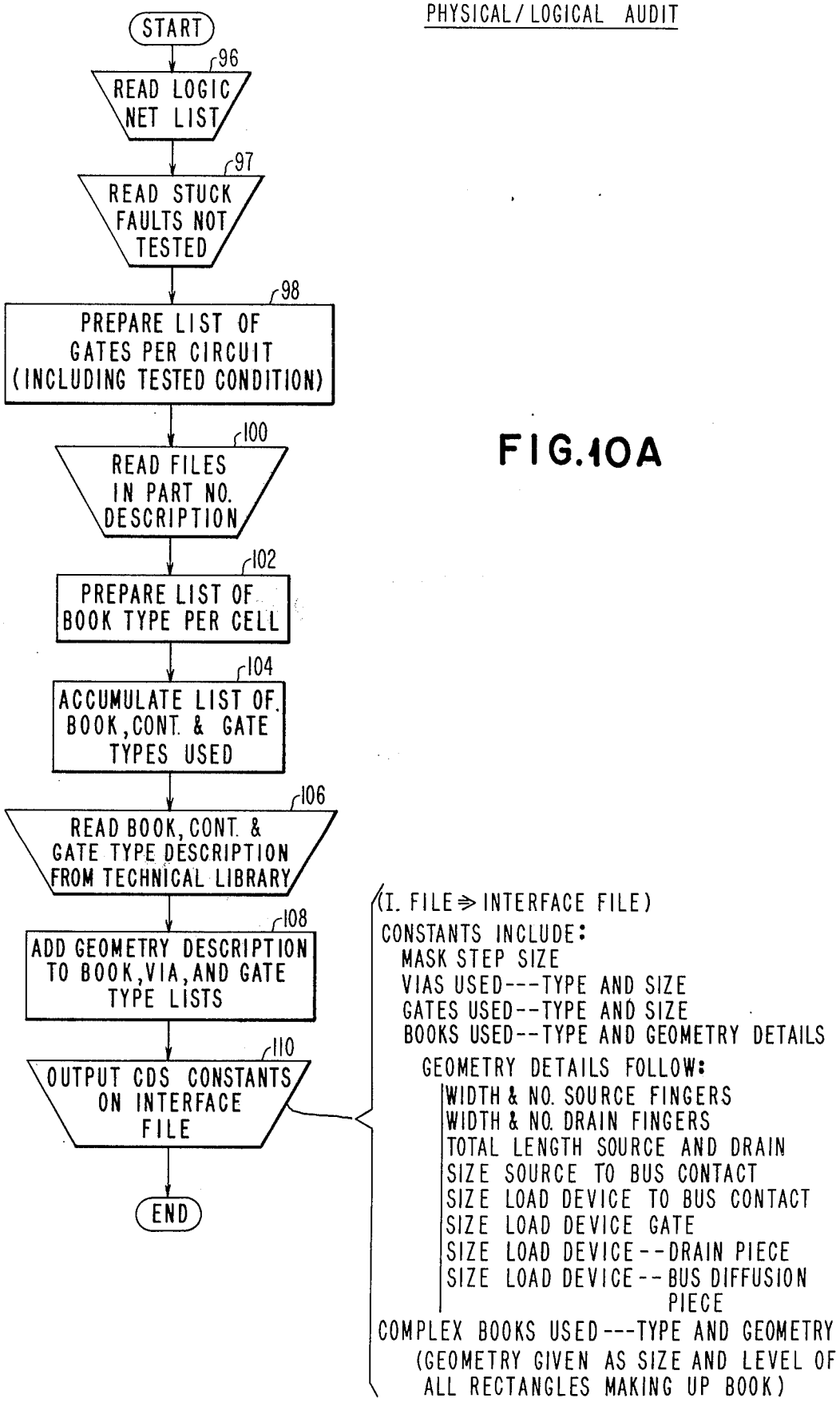
Figure 10B:
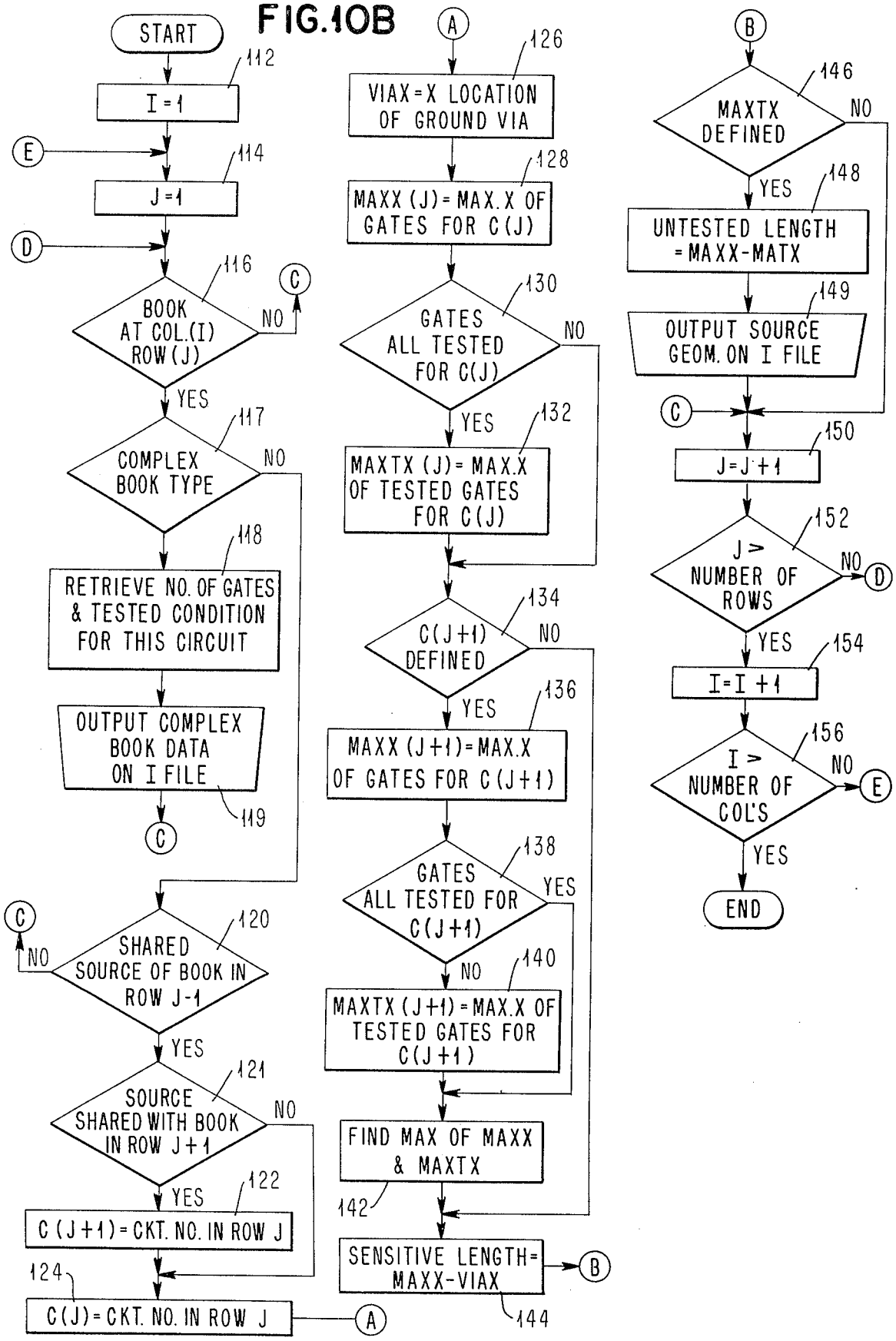

FIG. 18A2
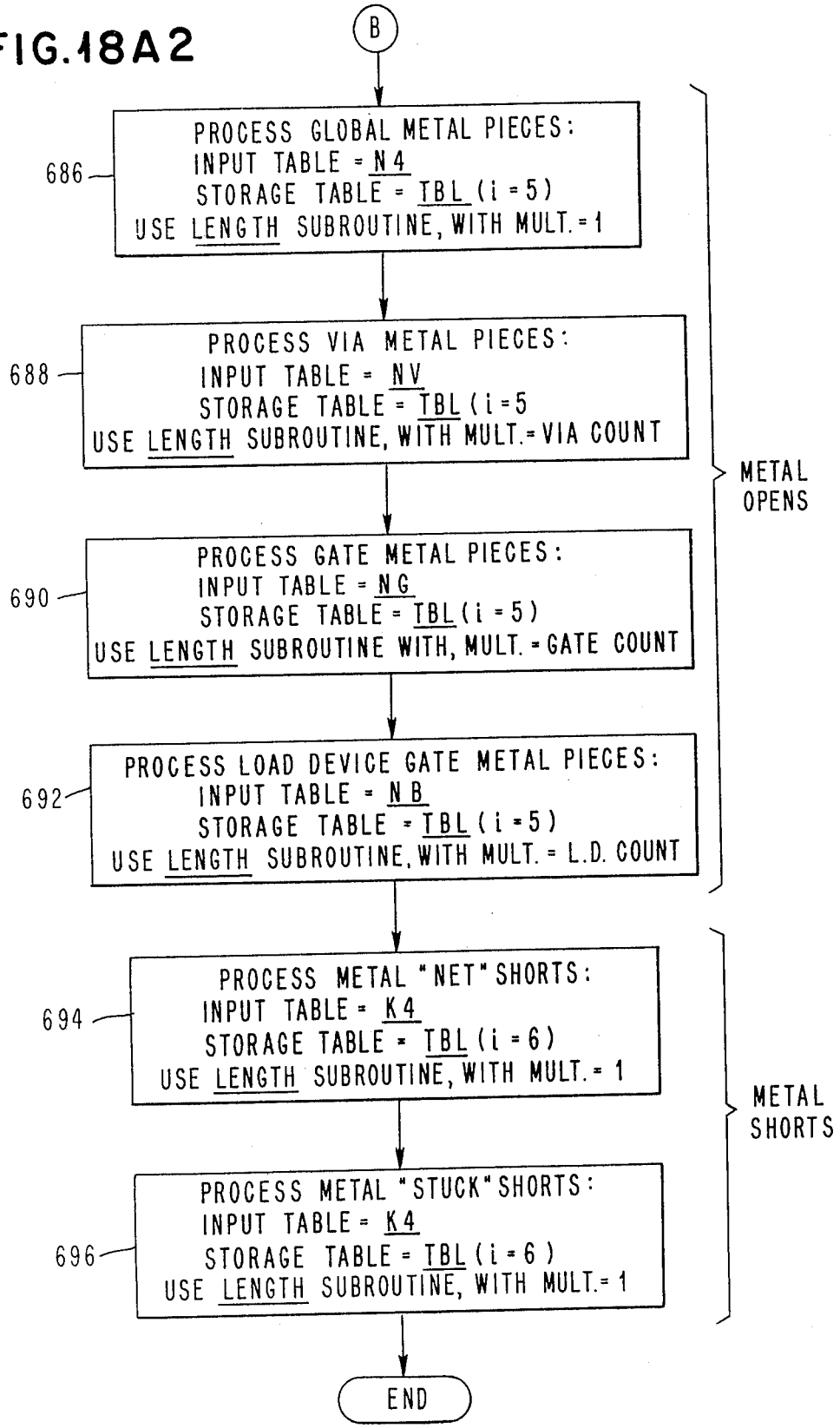

S-II
LENGTH SUBROUTINE

ACTUAL FAULT SUSCEPTIBILITY FOR WIDTH (i) IS THEN $$\lambda i = Ro \cdot \left[ \frac{Rs(i)}{Rs_{(0)}} \cdot \Delta L(i) \right] \quad (12)$$

$$= Ro \cdot \left[ \Delta L' \right]$$

WHERE ΔL' IS EFFECTIVE LENGTH